US012785720B2

(12) United States Patent
Yang et al.

(10) Patent No.: US 12,785,720 B2
(45) Date of Patent: Nov. 3, 2026

(54) ERROR CORRECTING STORAGE DEVICE AND OPERATING METHOD OF STORAGE DEVICE

(71) Applicant: SAMSUNG ELECTRONICS CO., LTD., Suwon-si (KR)

(72) Inventors: Dae-Yeol Yang, Suwon-si (KR); Dong-Min Shin, Suwon-si (KR); Bohwan Jun, Suwon-si (KR); Youngjun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 18/628,043

(22) Filed: Apr. 5, 2024

(65) Prior Publication Data

US 2025/0125820 A1 Apr. 17, 2025

(30) Foreign Application Priority Data

Oct. 17, 2023 (KR) ........................ 10-2023-0139015

(51) Int. Cl.
*H03M 13/11* (2006.01)
*H03M 13/25* (2006.01)

(52) U.S. Cl.
CPC ..... *H03M 13/1105* (2013.01); *H03M 13/255* (2013.01)

(58) Field of Classification Search
CPC ............. G06F 11/1044; G06F 11/1048; G06F 11/1068; H03M 13/1105
See application file for complete search history.

(56) References Cited

U.S. PATENT DOCUMENTS

| | | | |
|---|---|---|---|
| 8,055,976 B2 | 11/2011 | Kim et al. | |
| 8,595,585 B2 | 11/2013 | Djordjevic et al. | |
| 9,362,956 B2 | 6/2016 | Mahdavifar et al. | |
| 9,407,294 B2 | 8/2016 | Hanham et al. | |
| 9,467,171 B1 * | 10/2016 | Varnica | H03M 13/6566 |
| 9,483,347 B2 | 11/2016 | Wu et al. | |

(Continued)

FOREIGN PATENT DOCUMENTS

| | | |
|---|---|---|
| CN | 102915767 B | 12/2013 |
| CN | 106992026 A | 7/2017 |

(Continued)

OTHER PUBLICATIONS

Jang et al., "Improving the Tradeoff Between Error Correction and Detection of Concatenated Polar Codes," IEEE Transactions on Communications, vol. 69, No. 7, pp. 4254-4266, Jul. 2021.

(Continued)

*Primary Examiner* — Kamini B Patel
(74) *Attorney, Agent, or Firm* — Sughrue Mion, PLLC

(57) ABSTRACT

A storage device is provided. The storage device includes: a nonvolatile memory device; and a controller configured to: receive first data from the nonvolatile memory device; perform first error correction decoding with respect to the first data to obtain second data; control an error correction capability and an error detection capability of second error correction decoding based on information about the first error correction decoding; and perform the second error correction decoding with respect to the second data based on the error correction capability and the error detection capability to obtain third data.

20 Claims, 22 Drawing Sheets

(56) References Cited

U.S. PATENT DOCUMENTS

| | | | | |
|---|---|---|---|---|
| 9,524,208 | B2 | 12/2016 | Kim et al. | |
| 9,912,355 | B2 | 3/2018 | Motwani | |
| 10,868,566 | B2 * | 12/2020 | Yang | H03M 13/1125 |
| 11,258,466 | B1 | 2/2022 | Kanter et al. | |
| 11,581,906 | B1 | 2/2023 | Berman et al. | |
| 11,621,728 | B2 | 4/2023 | Xiong et al. | |
| 11,632,193 | B2 | 4/2023 | Xu et al. | |
| 2016/0266199 | A1 * | 9/2016 | Kurosawa | G11C 16/30 |
| 2017/0123898 | A1 * | 5/2017 | Ryabinin | G06F 3/0679 |
| 2018/0076929 | A1 * | 3/2018 | Zhang | H03M 13/611 |
| 2018/0278272 | A1 * | 9/2018 | Li | H04L 1/0061 |
| 2019/0042356 | A1 * | 2/2019 | Chen | G11C 16/26 |
| 2019/0190539 | A1 * | 6/2019 | Yang | H03M 13/6577 |
| 2019/0372605 | A1 | 12/2019 | Li et al. | |
| 2020/0036477 | A1 | 1/2020 | Xu et al. | |
| 2020/0067638 | A1 * | 2/2020 | Zhou | H03M 13/13 |
| 2020/0228145 | A1 | 7/2020 | Ahn et al. | |
| 2021/0013902 | A1 * | 1/2021 | Jang | H03M 13/13 |
| 2021/0399747 | A1 * | 12/2021 | Feng | H03M 13/2906 |
| 2023/0085776 | A1 | 3/2023 | Bassa et al. | |

FOREIGN PATENT DOCUMENTS

| | | | |
|---|---|---|---|
| EP | 3 613 162 | A1 | 10/2018 |
| KR | 10-2110767 | B1 | 6/2020 |
| KR | 10-2532611 | B1 | 5/2023 |
| WO | 2018/192640 | A1 | 10/2018 |

OTHER PUBLICATIONS

Zhang et al., “Interleaver Design for LDPC-partial polar codes based on EXIT analysis,” 2018 15th International Symposium on Wireless Communication Systems (ISWCS), 2018, Total 5 pages,.

Ye et al., “Concatenations of Systematic Polar Codes With Inner Repeat Accumulate Codes,” 2016 25th Wireless and Optical Communication Conference (WOCC), 2016, Total 4 pages.

Liu et al., “A Merged BP Decoding Algorithm for Polar-LDPC Concatenated Codes,” 2017 22nd International Conference on Digital Signal Processing (DSP), 2017, Total 6 pages.

Ma et al., “Parallel Concatenated Code Combining Polar Code and LDPC Code on AWGN Channel,” 2021 IEEE 15th International Conference on Anti-counterfeiting, Security, and Identification (ASID), 2021, Total 4 pages.

* cited by examiner

FIG. 12

| | |
|---|---|
| Increase Detection Capability | - Greater degree of variable nodes<br>- Less number of cycles<br>- Longer length of cycle |
| Increase Correction Capability | - Less degree of variable nodes<br>- Greater number of cycles<br>- Shorter length of cycle |

FIG. 13

| | |
|---|---|
| Increase Detection Capability | - Less number of check nodes not satisfying check condition<br>- Greater number of iterations of LDPC decoding<br>- Less syndrome weight |
| Increase Correction Capability | - Greater number of check nodes not satisfying check condition<br>- Less number of iterations of LDPC decoding<br>- Greater syndrome weight |

FIG. 18

| | |
|---|---|
| Increase Detection Capability | - Less number of check nodes not satisfying check condition<br>- Greater number of iterations of LDPC decoding<br>- Less syndrome weight<br>- Greater number of iterations of combinational decoding |
| Increase Correction Capability | - Greater number of check nodes not satisfying check condition<br>- Less number of iterations of LDPC decoding<br>- Greater syndrome weight<br>- Less number of iterations of combinational decoding |

ERROR CORRECTING STORAGE DEVICE AND OPERATING METHOD OF STORAGE DEVICE

CROSS-REFERENCE TO RELATED APPLICATION

This application claims priority to Korean Patent Application No. 10-2023-0139015, filed on Oct. 17, 2023, in the Korean Intellectual Property Office, the disclosure of which is incorporated by reference herein in its entirety.

BACKGROUND

The present disclosure relates to an electronic device, and more particularly, to a storage device correcting an error with improved accuracy and an operating method of the storage device.

A storage device refers to a device, which stores data under control of a host device, such as a computer, a smartphone, or a smart pad. The storage device includes a device, which stores data on a magnetic disk, such as a hard disk drive (HDD), or a device, which stores data in a semiconductor memory, in particular, a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), or a ferroelectric RAM (FRAM).

As semiconductor manufacturing technologies develop, integration and storage capacity of a storage device continue to increase. The high integration of the storage device makes it possible to reduce manufacturing complexity. However, the high integration of the storage device causes a decrease in the scale of the storage device and a change in the structure of the storage device. In this case, various issues which do not exist until the now are being discovered, leading to new issues that may damage or corrupt the data stored in the storage device, and decrease reliability of the storage device. Accordingly, there is a continuous demand for a method and device capable of improving the reliability of the storage device.

SUMMARY

One or more embodiments provide a storage device improving reliability by correcting an error with improved accuracy and an operating method of the storage device.

According to an aspect of an embodiment, a storage device includes: a nonvolatile memory device; and a controller configured to: receive first data from the nonvolatile memory device; perform first error correction decoding with respect to the first data to obtain second data; control an error correction capability and an error detection capability of second error correction decoding based on information about the first error correction decoding; and perform the second error correction decoding with respect to the second data based on the error correction capability and the error detection capability to obtain third data.

According to an aspect of an embodiment, a storage device includes: a nonvolatile memory device; and a controller configured to: receive first data from the nonvolatile memory device; perform first error correction decoding with respect to the first data to obtain second data; control a method of performing second error correction decoding based on information of the first error correction decoding; perform second error correction decoding with respect to the second data to obtain third data, based on the method; and repeatedly perform the first error correction decoding and the second error correction decoding by further performing the first error correction decoding and the second error correction decoding with respect to the third data.

According to an aspect of an embodiment, a method of operating a storage device which includes a nonvolatile memory device and a controller, is provided. The method includes: performing, by the controller, Low Density Parity Check (LDPC) decoding with respect to first data transferred from the nonvolatile memory device to obtain second data; controlling, by the controller, an error correction capability and an error detection capability of polar code Successive Cancelation List (SCL) decoding, based on decoding information about the LDPC decoding; and performing, by the controller, the polar code SCL decoding with respect to the second data based on the error correction capability and the error detection capability to obtain third data.

BRIEF DESCRIPTION OF DRAWINGS

The above and other aspects and features will be more apparent from the following description of embodiments, taken in conjunction with the accompanying drawings.

FIG. 12 illustrates conditions under which an SCL decoder increases an error detection capability or an error correction capability according to an embodiment.

FIG. 13 illustrates conditions under which an SCL decoder increases an error detection capability or an error correction capability according to an embodiment.

FIG. 18 illustrates conditions under which an SCL decoder increases an error detection capability or an error correction capability according to an embodiment.

DETAILED DESCRIPTION

Figure 1:
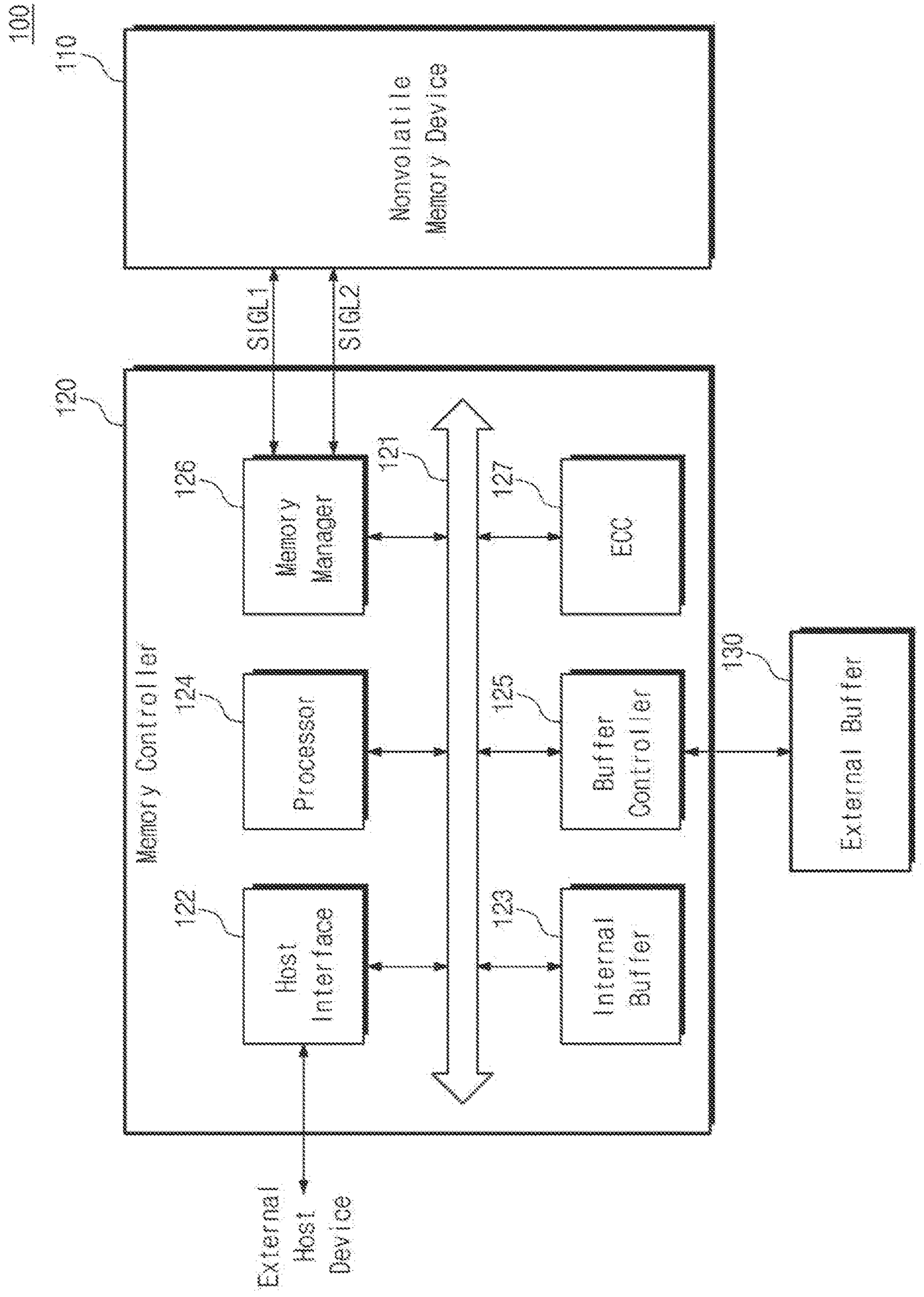
FIG. 1 illustrates a storage device according to an embodiment.

Below, embodiments will be described with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure.

FIG. 1 illustrates a storage device 100 according to an embodiment. Referring to FIG. 1, the storage device 100 may include a nonvolatile memory device 110, a memory controller 120, and an external buffer 130. The nonvolatile memory device 110 may include a plurality of memory cells. Each of the plurality of memory cells may store two or more bits. For example, the nonvolatile memory device 110 may include at least one of various nonvolatile memory devices such as a flash memory device, a phase-change memory device, a ferroelectric memory device, a magnetic memory device, and a resistive memory device.

The memory controller 120 may receive various requests from an external host device for writing data in the nonvolatile memory device 110 or reading data from the nonvolatile memory device 110. The memory controller 120 may store (or buffer) user data communicated with the external host device in the external buffer 130 and may store metadata for managing the storage device 100 in the external buffer 130.

The memory controller 120 may access the nonvolatile memory device 110 through first signal lines SIGL1 and second signal lines SIGL2. For example, the memory controller 120 may transmit a command and an address to the nonvolatile memory device 110 through the first signal lines SIGL1. The memory controller 120 may exchange data with the nonvolatile memory device 110 through the first signal lines SIGL1.

The memory controller 120 may transmit a first control signal to the nonvolatile memory device 110 through the second signal lines SIGL2. The memory controller 120 may receive a second control signal from the nonvolatile memory device 110 through the second signal lines SIGL2.

In an embodiment, the memory controller 120 may be configured to control two or more nonvolatile memory devices. The memory controller 120 may provide first signal lines and second signal lines for each of the two or more nonvolatile memory devices.

As another example, the memory controller 120 may share the first signal lines with respect to the two or more nonvolatile memory devices. The memory controller 120 may share some of the second signal lines with respect to the two or more nonvolatile memory devices and may separately provide the others thereof.

The external buffer 130 may include a random access memory. For example, the external buffer 130 may include at least one of a dynamic random access memory, a phase-change random access memory, a ferroelectric random access memory, a magnetic random access memory, and a resistive random access memory.

The memory controller 120 may include a bus 121, a host interface 122, an internal buffer 123, a processor 124, a buffer controller 125 (e.g., a buffer control circuit), a memory manager 126 (e.g., a memory manager circuit), and an error correction code (ECC) block 127 (e.g., an ECC circuit).

The bus 121 may provide communication channels between the components of the memory controller 120. The host interface 122 may receive various requests from the external host device and may parse the received requests. The host interface 122 may store the parsed requests in the internal buffer 123.

The host interface 122 may transmit various responses to the external host device. The host interface 122 may exchange signals with the external host device in compliance with a given communication protocol. The internal buffer 123 may include a random access memory. For example, the internal buffer 123 may include a static random access memory or a dynamic random access memory.

The processor 124 may execute an operating system or firmware for driving the memory controller 120. The processor 124 may read the parsed requests stored in the internal buffer 123 and may generate addresses and commands for controlling the nonvolatile memory device 110. The processor 124 may provide the generated commands and addresses to the memory manager 126.

The processor 124 may store various metadata for managing the storage device 100 in the internal buffer 123. The processor 124 may access the external buffer 130 through the buffer controller 125. The processor 124 may control the buffer controller 125 and the memory manager 126 such that the user data stored in the external buffer 130 are provided to the nonvolatile memory device 110.

The processor 124 may control the host interface 122 and the buffer controller 125 such that the data stored in the external buffer 130 are provided to the external host device. The processor 124 may control the buffer controller 125 and the memory manager 126 such that the data received from the nonvolatile memory device 110 are stored in the external buffer 130. The processor 124 may control the host interface 122 and the buffer controller 125 such that the data received from the external host device are stored in the external buffer 130.

Under control of the processor 124, the buffer controller 125 may write data in the external buffer 130 or may read data from the external buffer 130. The memory manager 126 may communicate with the nonvolatile memory device 110 through the first signal lines SIGL1 and the second signal lines SIGL2 under control of the processor 124.

The memory manager 126 may access the nonvolatile memory device 110 under control of the processor 124. For example, the memory manager 126 may access the nonvolatile memory device 110 through the first signal lines SIGL1 and the second signal lines SIGL2. The memory manager 126 may communicate with the nonvolatile memory device 110, based on a protocol in compliance with the standard or defined by a manufacturer.

The error correction code block 127 may perform error correction encoding with respect to data to be provided to the nonvolatile memory device 110 by using the error correction code ECC. The error correction code block 127 may perform error correction decoding with respect to data received from the nonvolatile memory device 110 by using the error correction code ECC.

In an embodiment, the external buffer 130 and the buffer controller 125 may be omitted from the storage device 100. When the external buffer 130 and the buffer controller 125 are omitted, the functions which are described as being performed by the external buffer 130 and the buffer controller 125 may be performed by the internal buffer 123.

Figure 2:
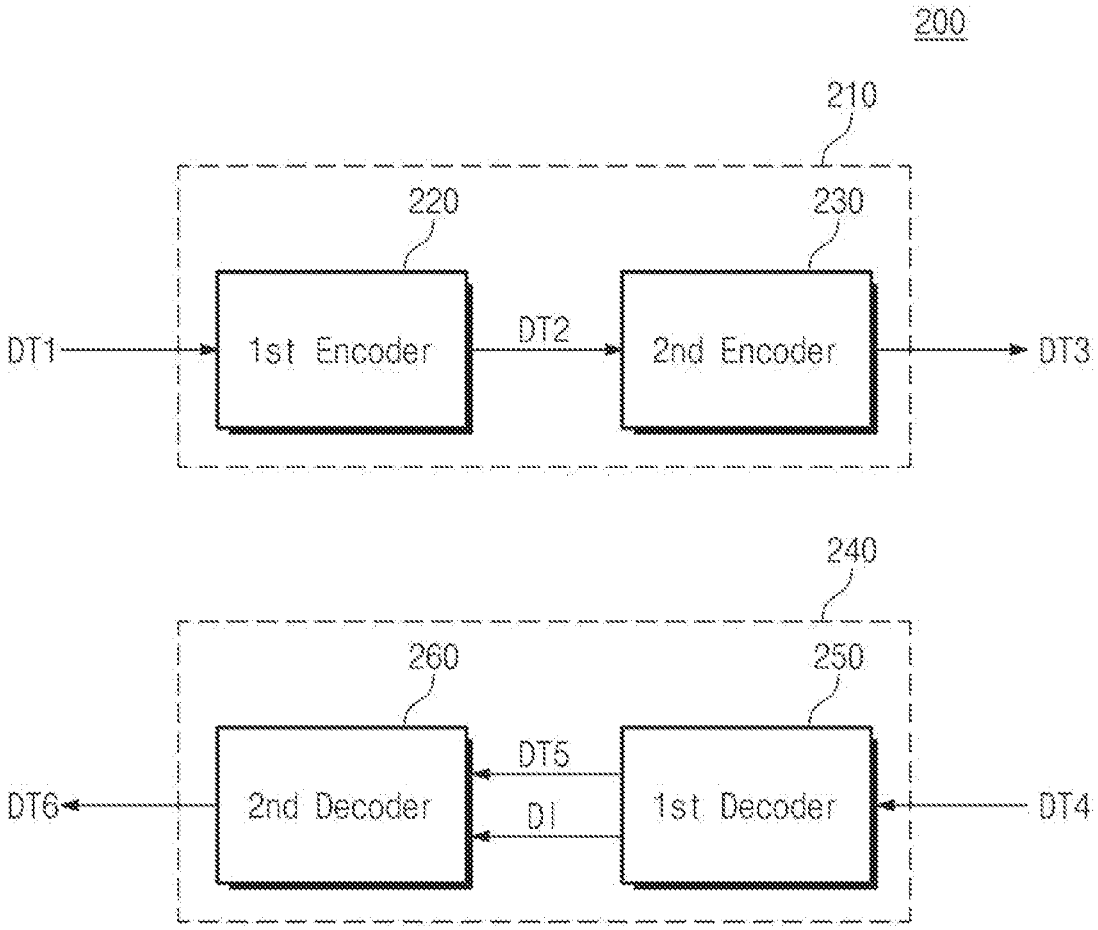
FIG. 2 illustrates an error correction code block according to an embodiment.

FIG. 2 illustrates an error correction code block 200 according to an embodiment. In an embodiment, the error correction code block 200 may correspond to the error correction code block 127 of the memory controller 120 of the storage device 100 of FIG. 1.

Referring to FIGS. 1 and 2, the error correction code block 200 may include an encoding block 210 and a decoding block 240. The encoding block 210 may perform error correction encoding with respect to first data DT1 to be written in the nonvolatile memory device 110. The decoding block 240 may perform error correction decoding with respect to fourth data DT4 read from the nonvolatile memory device 110.

The encoding block 210 may include a first encoder 220 and a second encoder 230. The first encoder 220 may perform first error correction encoding with respect to the first data DT1 and may generate second data DT2. For example, the first error correction encoding may include Cyclic Redundancy Check (CRC) code encoding or encoding in which Parity Check (PC) code encoding and polar code encoding are combined (or concatenated). However, a kind of the first error correction encoding is not limited thereto.

The second encoder 230 may perform second error correction encoding with respect to the second data DT2 and may generate third data DT3. For example, the second error correction encoding may include Low Density Parity Check (LDPC) encoding. However, a kind of the second error correction encoding is not limited thereto.

The decoding block 240 may include a first decoder 250 and a second decoder 260. The first decoder 250 may perform first error correction decoding with respect to the fourth data DT4 and may generate fifth data DT5. For example, the first error correction decoding may include LDPC decoding. However, a kind of the first error correction decoding is not limited thereto.

The first decoder 250 may generate decoding information DI about the first error correction decoding. For example, the decoding information DI may include information about the structure of the first decoder 250 or information about the status of the first error correction decoding (e.g., the status of the result of the first error correction decoding). The first decoder 250 may transfer the decoding information DI to the second decoder 260.

The second decoder 260 may receive the decoding information DI from the first decoder 250. The second decoder 260 may adjust the way for the second decoder 260 to perform second error correction decoding, based on the decoding information DI about the first error correction decoding. For example, the second decoder 260 may control the second error correction decoding based on the decoding information DI about the first error correction decoding.

The second decoder 260 may perform the second error correction decoding with respect to the fifth data DT5 and may generate sixth data DT6. For example, the second error correction decoding may include CRC code decoding or decoding in which PC code decoding and polar code decoding, for example, Successive Cancelation List (SCL) decoding (or polar code SCL decoding) are combined (or concatenated). However, a kind of the second error correction decoding is not limited thereto.

According to an embodiment, the decoding block 240 may combine (or concatenate) and perform heterogeneous error correction decoding. In this case, the decoding block 240 may control the second error correction decoding to be performed after the first error correction decoding, based on the decoding information DI of the first error correction decoding performed previously. Because the decoding information DI of the first error correction decoding performed previously is applied to the second error correction decoding to be performed after the first error correction decoding, the accuracy of error detection or correction of the decoding block 240 may be further improved.

Figure 3:
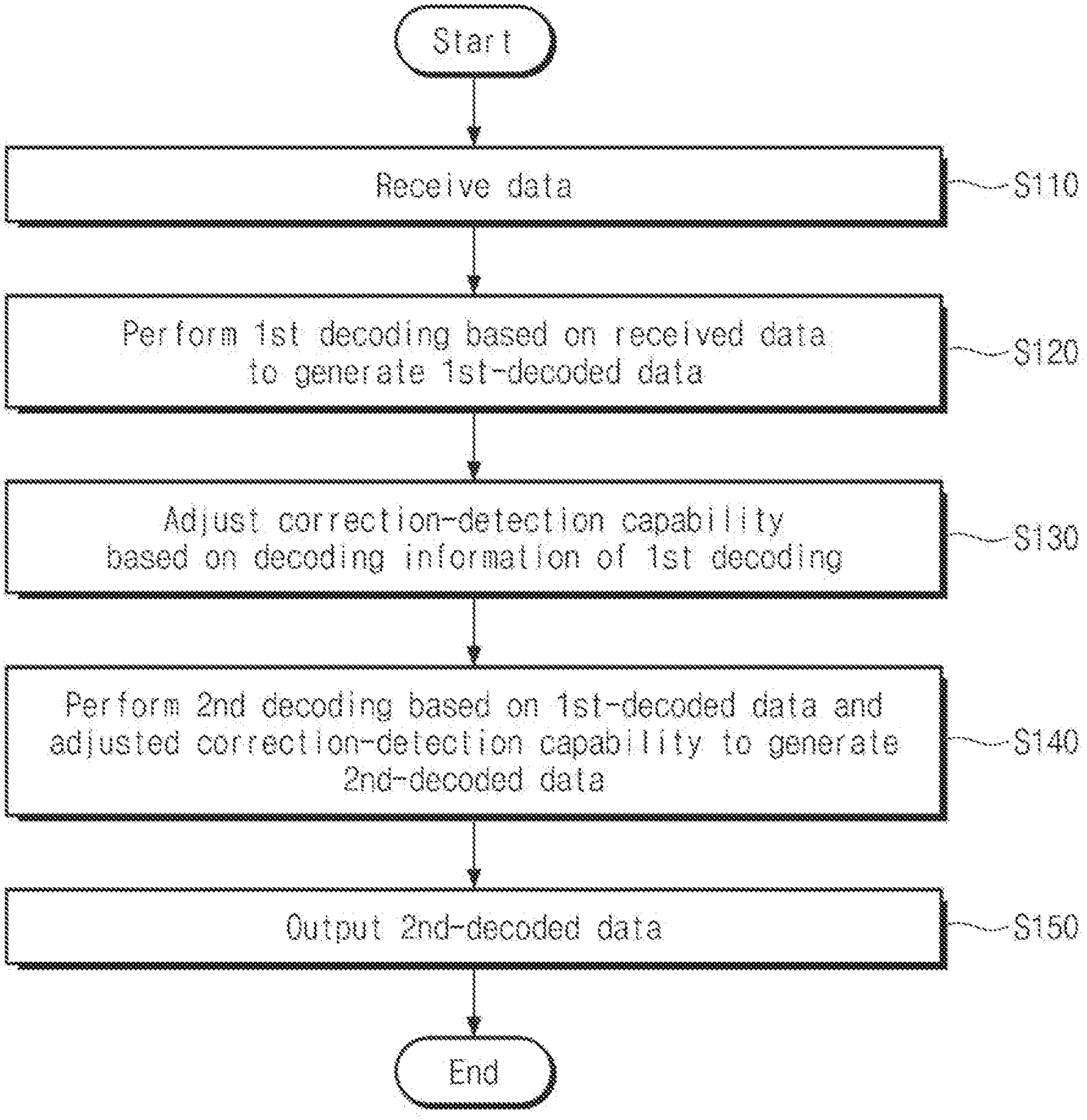
FIG. 3 illustrates a method in which an error correction code block performs error correction decoding according to an embodiment.

FIG. 3 illustrates an example of a method in which the error correction code block 200 performs error correction decoding. Referring to FIGS. 1, 2, and 3, in operation S110, the error correction code block 200 may receive data. For example, the decoding block 240 of the error correction code block 200 may receive the fourth data DT4 read from the nonvolatile memory device 110 through the bus 121.

In operation S120, the decoding block 240 may perform first decoding based on the received data and may generate first decoded data. For example, the first decoder 250 of the decoding block 240 may perform first error correction decoding (e.g., LDPC decoding) with respect to the fourth data DT4 and may generate the fifth data DT5 as the first decoded data.

In operation S130, the decoding block 240 may adjust the correction-detection capability based on the decoding information DI of the first decoding. For example, the first decoder 250 of the decoding block 240 may transfer the decoding information DI about the first error correction decoding to the second decoder 260. For example, when the first decoder 250 performs the first error correction decoding by LDPC decoding, the decoding information DI may indicate LDPC decoding and characteristics of the LDPC decoding. The second decoder 260 may determine a method of performing second error correction decoding (e.g., SCL decoding) based on the decoding information DI. For example, the second decoder 260 may increase the error correction capability or may decrease the error detection capability, or the second decoder 260 may decrease the error correction capability or may increase the error detection capability.

In operation S140, the decoding block 240 may perform second decoding based on the first decoded data and the adjusted correction-detection capability and may generate second decoded data. For example, the decoding block 240 may perform the second error correction decoding with respect to the fifth data DT5 based on the adjusted error correction capability and the adjusted error detection capability and may generate the sixth data DT6 as the second decoded data.

In operation S150, the decoding block 240 may output the second decoded data. For example, the second decoder 260 of the decoding block 240 may output the sixth data DT6 as error correction-completed data.

As described above, the decoding block 240 may adjust the error correction capability and the error detection capability of the second decoder 260 based on the decoding information DI of the first decoder 250. In an embodiment, when the decoding information DI indicates that the reliability of the fifth data DT5 is relatively low, the decoding block 240 may increase the error correction capability of the second decoder 260 and may decrease the error detection capability of the second decoder 260. When the decoding information DI indicates that the reliability of the fifth data DT5 is relatively high, the decoding block 240 may decrease the error correction capability of the second decoder 260 and may increase the error detection capability of the second decoder 260.

As the way for the second decoder 260 to perform the second error correction decoding is adjusted based on the decoding information DI associated with the first decoder 250, the decoding block 240 may correct and detect an error with improved accuracy and may improve the reliability of the sixth data DT6.

Figure 4:
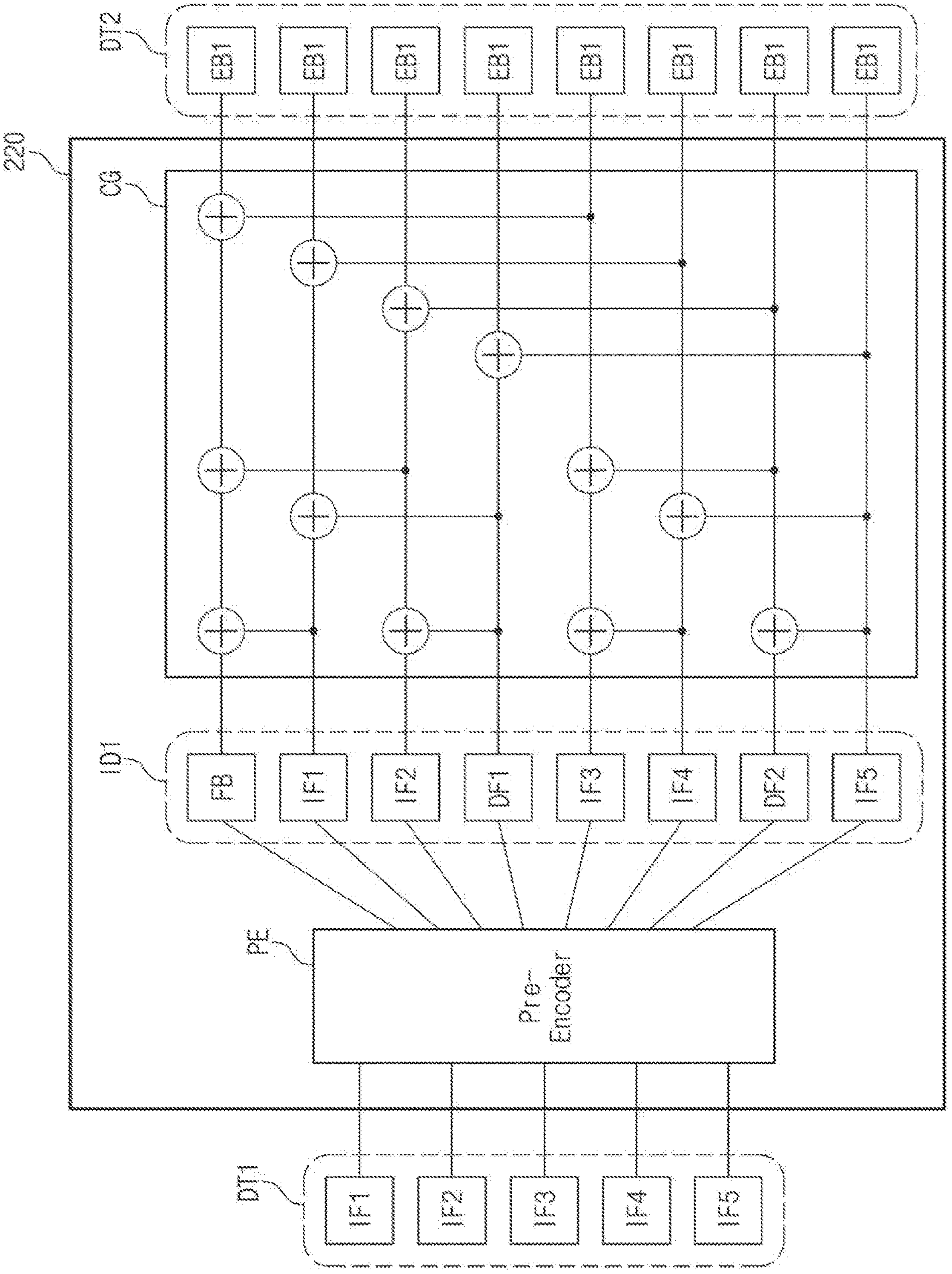
FIG. 4 illustrates a first encoder of an encoding block according to an embodiment.

FIG. 4 illustrates an example of the first encoder 220 of the encoding block 210. Referring to FIGS. 1, 2, and 4, the first encoder 220 may receive the first data DT1. The first data DT1 may include first information bit IF1, second information bit IF2, third information bit IF3, fourth information bit IF4, and fifth information bit IF5. The first information bit IF1, the second information bit IF2, the third information bit IF3, the fourth information bit IF4, and the fifth information bit IF5 may constitute data which the external host device intends to write in the storage device 100.

The first encoder 220 may include a pre-encoder PE and a code graph CG. The pre-encoder PE may receive the first data DT1. The pre-encoder PE may generate first intermediate data ID1 by adding a frozen bit FB, a first dynamic frozen bit DF1, and a second dynamic frozen bit DF2 to the first information bit IF1, the second information bit IF2, the third information bit IF3, the fourth information bit IF4, and the fifth information bit IF5 of the first data DT1.

For example, the first intermediate data ID1 may sequentially include the frozen bit FB, the first information bit IF1, the second information bit IF2, the first dynamic frozen bit DF1, the third information bit IF3, the fourth information bit IF4, the second dynamic frozen bit DF2, and the fifth information bit IF5.

For example, the frozen bit FB may have a fixed value. For example, the frozen bit FB may have a value of "0" or "1".

Each of the first dynamic frozen bit DF1 and the second dynamic frozen bit DF2 may have a value which is determined based on values of preceding information bits. For example, the first dynamic frozen bit DF1 may have a value which allows a fixed value, for example, a value of "0" or "1" to be obtained when the exclusive-OR (XOR) operation is performed together with a value of the first information bit IF1 and a value of the second information bit IF2. For example, the pre-encoder PE may determine the first dynamic frozen bit DF1 by performing the XOR operation based on the first information bit IF1 and the second information bit IF2. The second dynamic frozen bit DF2 may have a value which allows a fixed value, for example, a value of "0" or "1" to be obtained when the exclusive-OR (XOR) operation is performed together with a value of the third information bit IF3 and a value of the fourth information bit IF4. For example, the pre-encoder PE may determine the second dynamic frozen bit DF2 by performing the XOR operation based on the third information bit IF3 and the fourth information bit IF4.

The code graph CG may apply polar code encoding to the first intermediate data ID1. The code graph CG may include bit lines transferring bits of the first intermediate data ID1 to bits of the second data DT2. The code graph CG may include a plurality of XOR operations. Each of the plurality of XOR operations may be performed between two bit lines.

In the code graph CG, each XOR operation may be expressed by a circle in which an addition sign is included and a line connected to the circle. The XOR operation may output a value, which is obtained by performing the XOR operation on a bit of a bit line connected to a line and a bit of a bit line connected to a circle, to a bit line connected to the circle. A calculation result of the code graph CG may be the second data DT2 including first encoded bits EB1.

The number of bits of the first data DT1, the number of bits of the first intermediate data ID1, and the number of bits of the second data DT2 are illustrated in FIG. 4 in detail. However, according to an embodiment, the number of bits of the first data DT1, the number of bits of the first intermediate data ID1, and the number of bits of the second data DT2 are not limited thereto.

Figure 5:
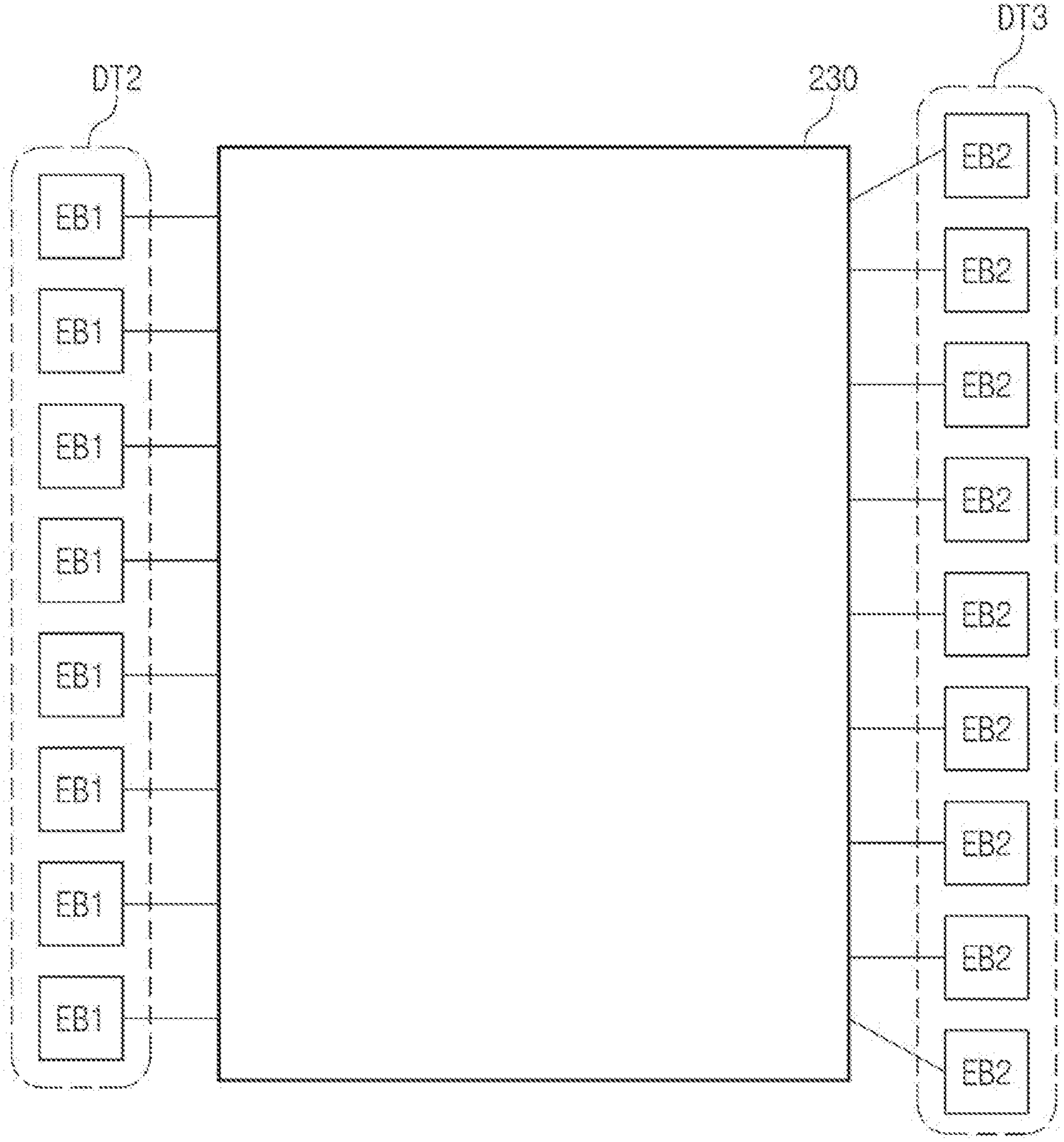
FIG. 5 illustrates a second encoder of an encoding block according to an embodiment.

FIG. 5 illustrates an example of the second encoder 230 of the encoding block 210. Referring to FIGS. 1, 2, and 5, the second encoder 230 may receive the second data DT2. For example, the second data DT2 may include eight bits. The second encoder 230 may perform LDPC encoding with respect to the second data DT2 and may generate the third data DT3 including second encoded bits EB2. For example, the second encoder 230 may generate the second encoded bits EB2 of the third data DT3 by adding a parity bit(s) satisfying a check condition to the first encoded bits EB1 of the second data DT2. For example, the third data DT3 may include nine bits. For example, the second encoder 230 may add the parity bit(s) to a given position(s).

The number of bits of the second data DT2 and the number of bits of the third data DT3 are illustrated in FIG. 5 in detail. However, according to an embodiment, the number of bits of the second data DT2 and the number of bits of the third data DT3 are not limited thereto.

Figure 6:
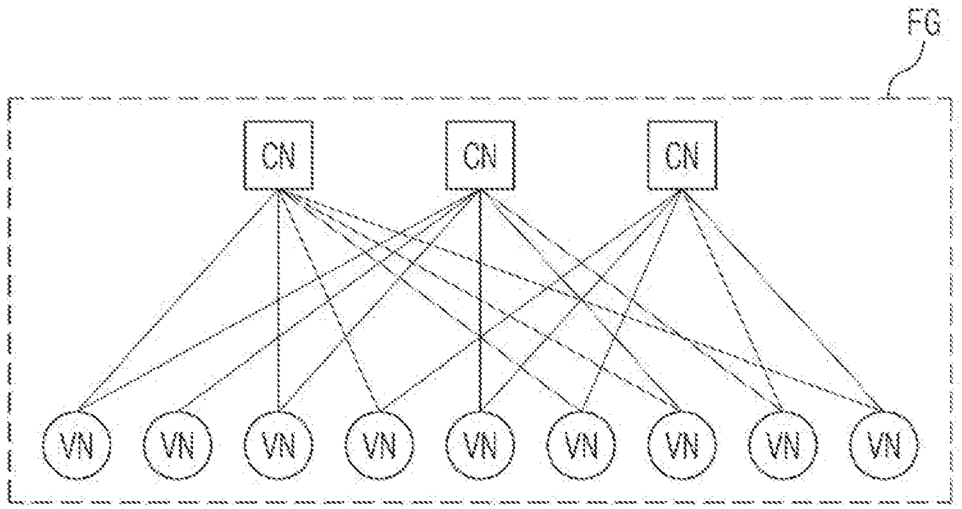
FIG. 6 illustrates a factor graph describing an operating principle of a second encoder according to an embodiment.

FIG. 6 illustrates an example of a factor graph FG describing an operating principle of the second encoder 230. Referring to FIGS. 1, 2, 5, and 6, the factor graph FG may include a plurality of check nodes CN and a plurality of variable nodes VN. Each of the plurality of variable nodes VN may be connected to two or more check nodes CN through edges. The number of edges connected to each variable node VN may be the degree of the variable node VN. Information about the degree of the variable node VN may be included as a portion of the decoding information DI.

The plurality of variable nodes VN may respectively correspond to the second encoded bits EB2 of the third data DT3. That is, the variable nodes VN may include the first encoded bits EB1 of the second data DT2 and the parity bit(s) added by the second encoder 230.

The second encoder 230 may add the parity bit(s) such that a sum of bits of the variable nodes VN connected to each check node CN is a fixed value, for example, "0" or "1". The check condition may be satisfied when a sum of bits of the variable nodes VN connected to each check node CN is a fixed value, for example, "0" or "1".

Figure 7:
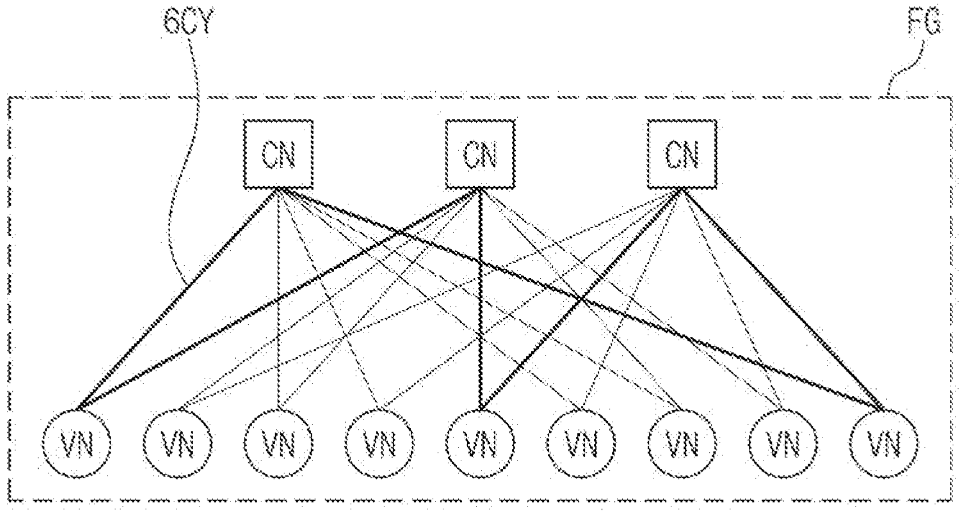
FIG. 7 illustrates an example in which a cycle is defined in a factor graph.

FIG. 7 illustrates an example in which a cycle CY is defined in the factor graph FG. In FIG. 7, as indicated by a solid line, a closed loop of edges, which starts from one variable node VN or one check node CN, passes through any other variable node(s) and any other check node(s) one by one, and reaches the variable node VN or the check node CN of the start point may be one cycle CY. As illustrated in FIG. 7, a cycle including 6 edges may have a length of 6 cycles (6CY). Information about the cycle of the factor graph FG may be included as a portion of the decoding information DI.

Figure 8:
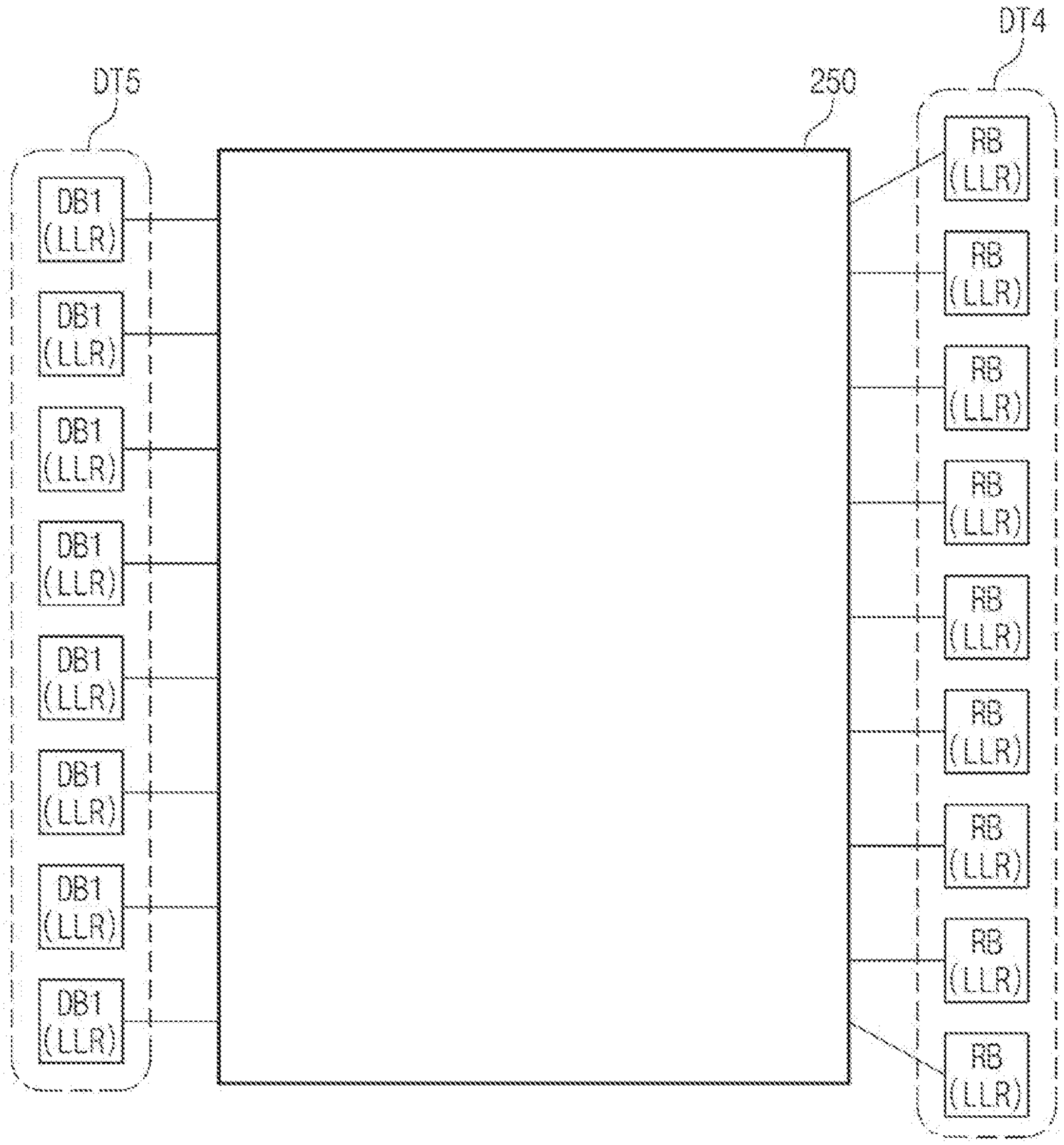
FIG. 8 illustrates a first decoder of a decoding block according to an embodiment.

FIG. 8 illustrates an example of the first decoder 250 of the decoding block 240. Referring to FIGS. 1, 2, and 8, the first decoder 250 may receive the fourth data DT4. The fourth data DT4 may include read bits RB read from the nonvolatile memory device 110. Each of the read bits RB may have a log-likelihood ratio LLR. Below, the log-likelihood ratio LLR may be used as the meaning similar to the term "likelihood ratio" or "likelihood", and may be used interchangeably.

The log-likelihood ratios LLR of the read bits RB may be initial log-likelihood ratios LLR. For example, the nonvolatile memory device 110 may read the read bits RB while changing read levels. For example, a read level may be a voltage level applied to a memory cell to read data stored in the memory cell. The first decoder 250 may assign the initial log-likelihood ratio LLR to each of the read bits RB, depending on whether a read bit maintains the same value or is variable in read operations according to the variable read levels.

The first decoder 250 may apply the factor graph FG of FIG. 6 to the read bits RB of the fourth data DT4. For example, based on the factor graph FG, the first decoder 250 may calculate a sum of values of variable nodes VN corresponding to each check node CN. The first decoder 250 may modify the log-likelihood ratios LLR of the read bits RB, based on a value of the calculated sum. The first decoder 250 may update values of the variable nodes VN, based on the sum calculated at each check node CN or values of the variable nodes VN transferred to each check node CN.

The first decoder 250 may repeat the update of the values of the variable nodes VN and the update of the values of the check nodes CN as much as a given number of times. For example, the given number of times may be determined in the process of manufacturing the first decoder 250 or may be set by the external host device or the processor 124 after the first decoder 250 is manufactured. The first decoder 250 may generate the fifth data DT5 by repeating the update of the values of the variable nodes VN and the update of the values of the check nodes CN as much as the given number of times and removing the parity bit(s) of the given position(s) added by the second encoder 230.

The fifth data DT5 may include first decoded bits DB1. The first decoded bits DB1 of the fifth data DT5 may have corresponding log-likelihood ratios LLR.

Figure 9:
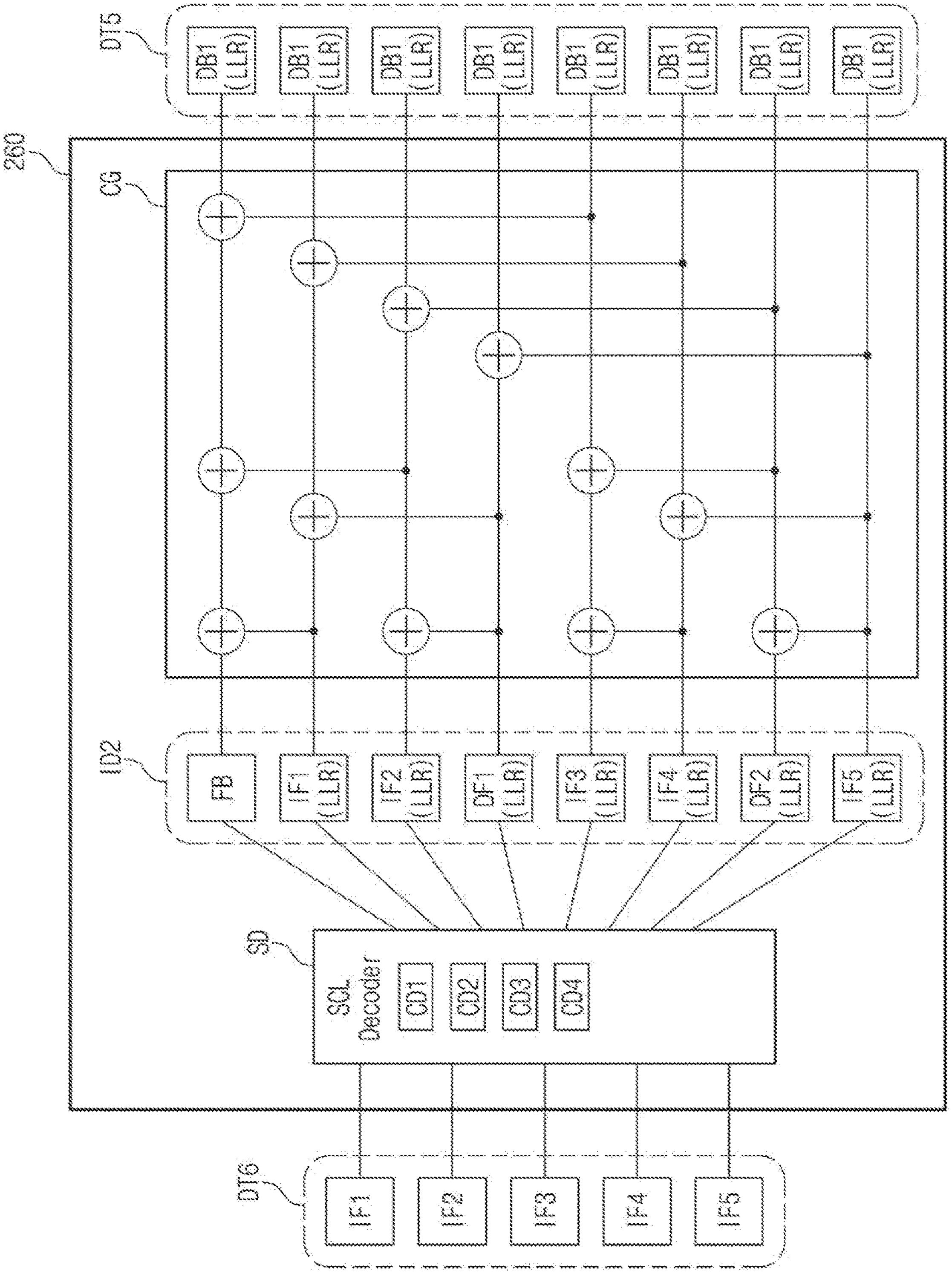
FIG. 9 illustrates a second decoder of a decoding block according to an embodiment.

FIG. 9 illustrates an example of the second decoder 260 of the decoding block 240. Referring to FIGS. 1, 2, and 9, the second decoder 260 may receive the fifth data DT5. The fifth data DT5 may include the first decoded bits DB1 and the corresponding log-likelihood ratios LLR.

The second decoder 260 may include the code graph CG and an SCL decoder SD. The code graph CG may apply polar code decoding to the fifth data DT5. The code graph CG may have the same structure as the code graph CG of FIG. 4 and may perform operations in a direction opposite to that of the code graph CG of FIG. 4.

A result of the operations of the code graph CG may be second intermediate data ID2. As in the first intermediate data ID1, the second intermediate data ID2 may sequentially include the frozen bit FB, the first information bit IF1, the second information bit IF2, the first dynamic frozen bit DF1, the third information bit IF3, the fourth information bit IF4, the second dynamic frozen bit DF2, and the fifth information bit IF5.

Because the frozen bit FB has a fixed value (e.g., a known bit), the frozen bit FB may not have the log-likelihood ratio LLR. Because the first information bit IF1, the second information bit IF2, the first dynamic frozen bit DF1, the third information bit IF3, the fourth information bit IF4, the second dynamic frozen bit DF2, and the fifth information bit IF5 have changed values, the bits IF1, IF2, DF1, IF3, IF4, DF2, and IF5 may have corresponding log-likelihood ratios LLR.

The SCL decoder SD may receive the second intermediate data ID2. The SCL decoder SD may generate a given number of candidate data based on values of the first information bit IF1, the second information bit IF2, the first dynamic frozen bit DF1, the third information bit IF3, the fourth information bit IF4, the second dynamic frozen bit DF2, and the fifth information bit IF5 and the corresponding log-likelihood ratios LLR. For example, the SCL decoder SD may generate first candidate data CD1, second candidate data CD2, third candidate data CD3, and fourth candidate data CD4.

The SCL decoder SD may select one of the first candidate data CD1, the second candidate data CD2, the third candidate data CD3, and the fourth candidate data CD4 to be output as the sixth data DT6. For example, the sixth data DT6 may be data whose error correction is completed by the decoding block 240. The sixth data DT6 may sequentially include the first information bit IF1, the second information bit IF2, the third information bit IF3, the fourth information bit IF4, and the fifth information bit IF5.

The SCL decoder SD may perform error correction and error detection. For example, the SCL decoder SD may use the first dynamic frozen bit DF1, the second dynamic frozen bit DF2, or the first dynamic frozen bit DF1 and the second dynamic frozen bit DF2 in error correction or error detection. The number of dynamic frozen bits which the SCL decoder SD uses in error correction may correspond to the error correction capability. For example, an increase in the number of dynamic frozen bits which the SCL decoder SD uses in error correction may cause an increase in the error correction capability. The number of dynamic frozen bits which the SCL decoder SD uses in error detection may correspond to the error detection capability. For example, an increase in the number of dynamic frozen bits which the SCL decoder SD uses in error detection may cause an increase in the error detection capability.

Figure 10:
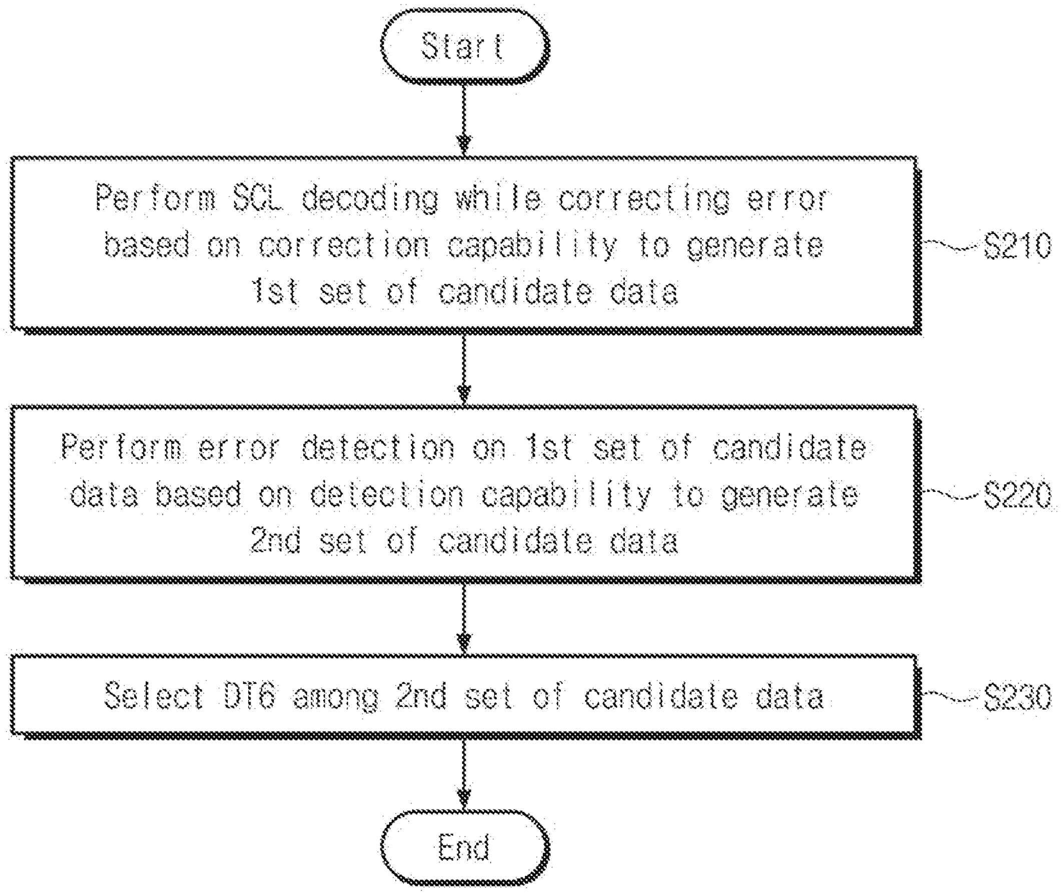
FIG. 10 illustrates a method in which a Successive Cancelation List (SCL) decoder performs SCL decoding according to an embodiment.

FIG. 10 illustrates an example of a method in which the SCL decoder SD performs SCL decoding. Referring to FIGS. 1, 2, 9, and 10, in operation S210, the SCL decoder SD may perform SCL decoding while correcting an error based on the correction capability and may generate a first set of candidate data. For example, the SCL decoder SD may sequentially select bits of the second intermediate data ID2 based on the log-likelihood ratios LLR of the bits of the second intermediate data ID2. The SCL decoder SD may sequentially select the bits of the second intermediate data ID2 while maintaining the first set of candidate data, the number of which is set in advance. When the first dynamic frozen bit DF1 is used for the error correction, the SCL decoder SD may correct an error by excluding a value not satisfying the rule of generating the first dynamic frozen bit DF1.

In operation S220, the SCL decoder SD may perform error detection with respect to the first set of candidate data based on the detection capability and may generate a second set of candidate data. For example, when the second dynamic frozen bit DF2 is used for the error detection, the SCL decoder SD may detect candidate data not satisfying the rule of generating the second dynamic frozen bit DF2 from the first set of candidate data as an error.

In operation S230, the SCL decoder SD may select the sixth data DT6 from the second set of candidate data. For example, the SCL decoder SD may select candidate data, which is regarded as having the smallest error (or having no error), as the sixth data DT6.

FIGS. 11A to 11D are graphs for describing the process in which the SCL decoder SD performs SCL decoding. Referring to FIGS. 1, 2, 9, and 11A, the SCL decoder SD may perform SCL decoding based on a graph which starts from a first node N1 and is expanded in the form of a tree. Each node may be connected to two edges respectively corresponding to “0” and “1”. Two edges may be connected to different nodes.

The SCL decoder SD may calculate a metric based on the log-likelihood ratio LLR of each bit of the one second intermediate data ID2 at each node. The metric may indicate the likelihood of a path from the first node N1 to each node. As a value of the metric decreases, the likelihood of a path to each node may become higher.

The SCL decoder SD may have a length of a given value. The SCL decoder SD may select and maintain a list of paths, the number of which corresponds to the given length value. For example, the SCL decoder SD may select and maintain a list of paths with a lower metric. As illustrated in FIG. 9, when the SCL decoder SD manages the first candidate data CD1, the second candidate data CD2, the third candidate data CD3, and the fourth candidate data CD4, a length (or a depth) of a list which the SCL decoder SD manages may be “4”.

Referring to FIGS. 1, 2, 9, 11A, and 11B, at the first node N1, the SCL decoder SD may select a value of the first information bit IF1 as the first bit having the log-likelihood ratio LLR from among the bits of the second intermediate data ID2. Because the length (or depth) of the list which the SCL decoder SD manages is “4”, the SCL decoder SD may select both a path on which the first information bit IF1 is “0” and a path on which the first information bit IF1 is “1”. The path on which the first information bit IF1 is “0” may be connected to a second node N2, and the path on which the first information bit IF1 is “1” may be connected to a third node N3. The SCL decoder SD may calculate a first metric M1 based on the likelihood of the path up to the second node N2 (or from the first node N1 to the second node N2) and may calculate a second metric M2 based on the likelihood of the path up to the third node N3 (or from the first node N1 to the third node N3).

At each of the second node N2 and the third node N3, the SCL decoder SD may select a value of the second information bit IF2 as the second bit having the log-likelihood ratio LLR from among the bits of the second intermediate data ID2. Because the length (or depth) of the list which the SCL decoder SD manages is “4”, the SCL decoder SD may select both a path on which the second information bit IF2 is “0” and a path on which the second information bit IF2 is “1”.

At the second node N2, the path on which the second information bit IF2 is “0” may be connected to a fourth node N4, and the path on which the second information bit IF2 is “1” may be connected to a fifth node N5. The SCL decoder SD may calculate a third metric M3 based on the likelihood of the path up to the fourth node N4 and may calculate a fourth metric M4 based on the likelihood of the path up to the fifth node N5.

At the third node N3, the path on which the second information bit IF2 is “0” may be connected to a sixth node N6, and the path on which the second information bit IF2 is “1” may be connected to a seventh node N7. The SCL decoder SD may calculate a fifth metric M5 based on the likelihood of the path up to the sixth node N6 and may calculate a sixth metric M6 based on the likelihood of the path up to the seventh node N7.

Figure 11A:
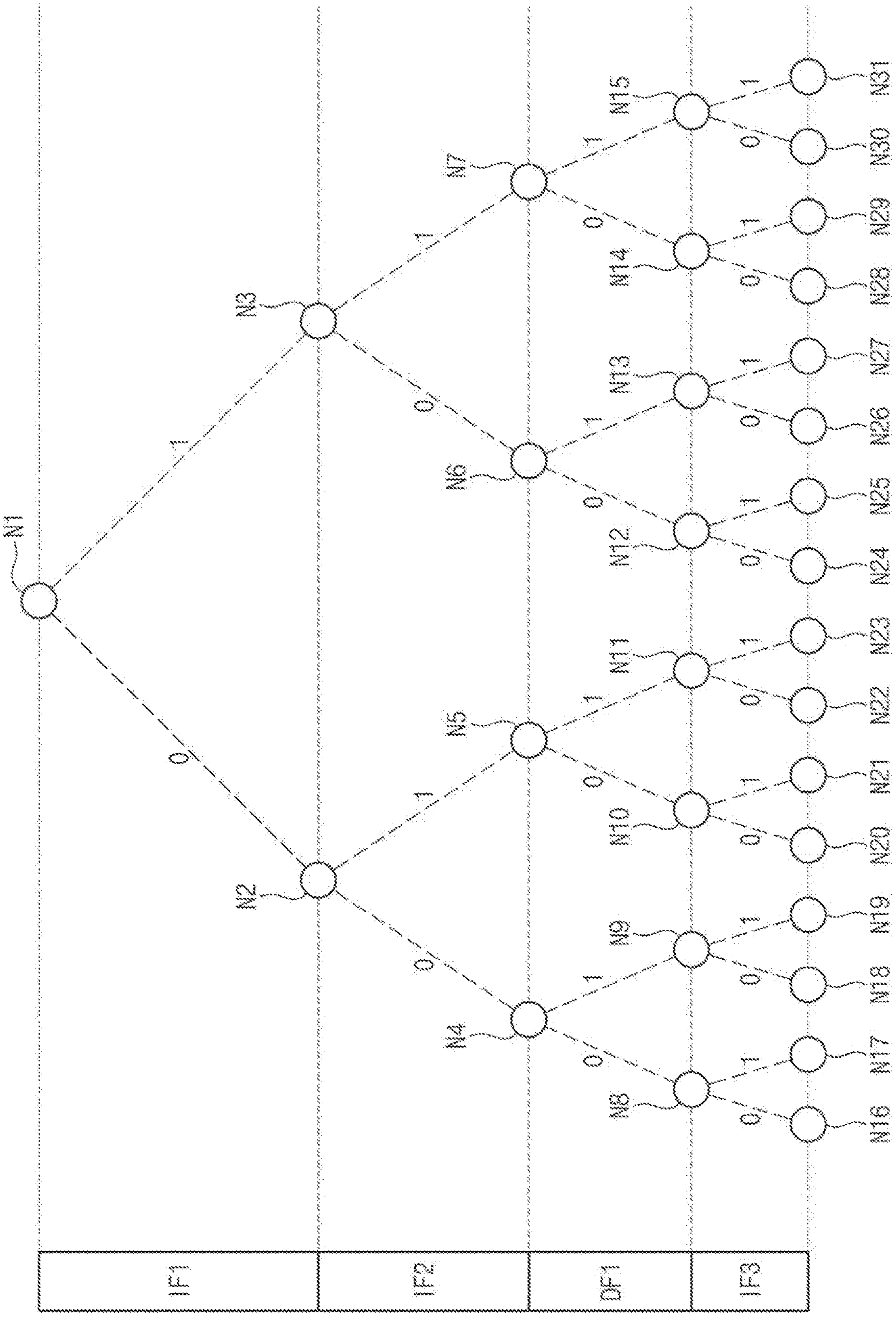
FIGS. 11A, 11B, 11C and 11D are graphs for describing a process in which an SCL decoder performs SCL decoding according to an embodiment.
Figure 11B:
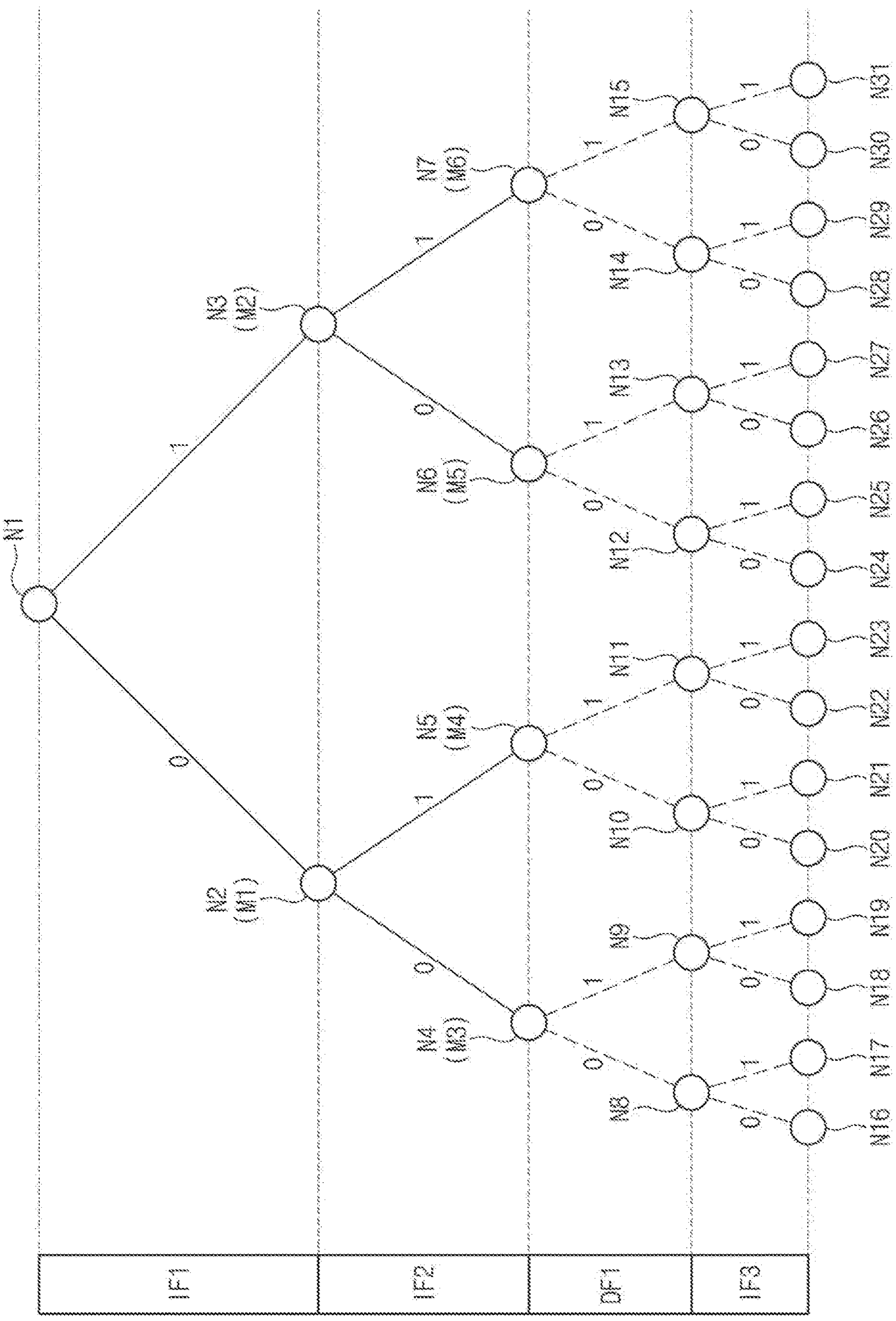
Figure 11C:
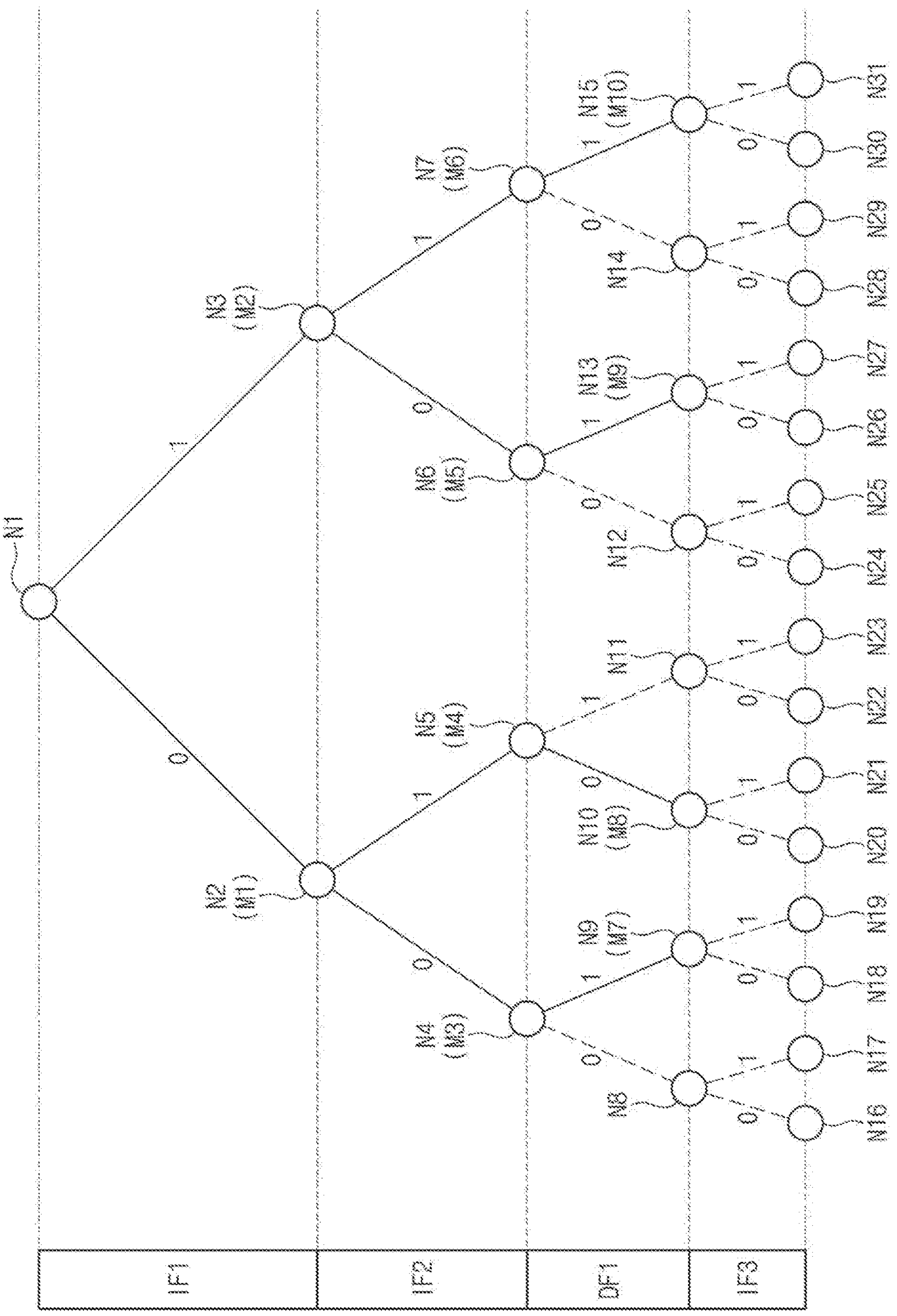

FIG. 11C illustrates an example in which the first dynamic frozen bit DF1 is used in error detection. Referring to FIGS. 1, 2, 9, 11B, and 11C, when the first dynamic frozen bit DF1 is used in error detection, the SCL decoder SD may use the first dynamic frozen bit DF1 in a manner similar to an information bit, in the process of selecting a path.

At each of the fourth node N4, the fifth node N5, the sixth node N6, and the seventh node N7, the SCL decoder SD may select a value of the first dynamic frozen bit DF1 as the third bit having the log-likelihood ratio LLR from among the bits of the second intermediate data ID2. Because the length (or depth) of the list which the SCL decoder SD manages is “4”, the SCL decoder SD may select four of eight paths extending from the fourth node N4, the fifth node N5, the sixth node N6, and the seventh node N7 and may prune the remaining four nodes.

At the fourth node N4, a path on which the first dynamic frozen bit DF1 is “0” may be connected to an eighth node N8, and a path on which the first dynamic frozen bit DF1 is “1” may be connected to a ninth node N9. At the fifth node N5, a path on which the first dynamic frozen bit DF1 is “0” may be connected to a tenth node N10, and a path on which the first dynamic frozen bit DF1 is “1” may be connected to an eleventh node N11.

At the sixth node N6, a path on which the first dynamic frozen bit DF1 is “0” may be connected to a twelfth node N12, and a path on which the first dynamic frozen bit DF1 is “1” may be connected to a thirteenth node N13. At the seventh node N7, a path on which the first dynamic frozen bit DF1 is “0” may be connected to a fourteenth node N14, and a path on which the first dynamic frozen bit DF1 is “1” may be connected to a fifteenth node N15.

In an embodiment, the SCL decoder SD may select the path up to the ninth node N9 and may calculate a seventh metric M7 based on the likelihood of the path up to the ninth node N9. The SCL decoder SD may select the path up to the tenth node N10 and may calculate an eighth metric M8 based on the likelihood of the path up to the tenth node N10.

The SCL decoder SD may select the path up to the thirteenth node N13 and may calculate a ninth metric M9 based on the likelihood of the path up to the thirteenth node N13. The SCL decoder SD may select the path up to the fifteenth node N15 and may calculate a tenth metric M10 based on the likelihood of the path up to the fifteenth node N15.

In an embodiment, at the eighth node N8, a path on which the third information bit IF3 is “0” may be connected to a sixteenth node N16, and a path on which the third information bit IF3 is “1” may be connected to a seventeenth node N17. At the ninth node N9, a path on which the third information bit IF3 is “0” may be connected to an eighteenth node N18, and a path on which the third information bit IF3 is "1" may be connected to a nineteenth node N19.

At the tenth node N10, a path on which the third information bit IF3 is "0" may be connected to a twentieth node N20, and a path on which the third information bit IF3 is "1" may be connected to a twenty-first node N21. At the eleventh node N11, a path on which the third information bit IF3 is "0" may be connected to a twenty-second node N22, and a path on which the third information bit IF3 is "1" may be connected to a twenty-third node N23.

At the twelfth node N12, a path on which the third information bit IF3 is "0" may be connected to a twenty-fourth node N24, and a path on which the third information bit IF3 is "1" may be connected to a twenty-fifth node N25. At the thirteenth node N13, a path on which the third information bit IF3 is "0" may be connected to a twenty-sixth node N26, and a path on which the third information bit IF3 is "1" may be connected to a twenty-seventh node N27.

At the fourteenth node N14, a path on which the third information bit IF3 is "0" may be connected to a twenty-eighth node N28, and a path on which the third information bit IF3 is "1" may be connected to a twenty-ninth node N29. At the fifteenth node N15, a path on which the third information bit IF3 is "0" may be connected to a thirtieth node N30, and a path on which the third information bit IF3 is "1" may be connected to a thirty-first node N31.

The SCL decoder SD may collect the first candidate data CD1, the second candidate data CD2, the third candidate data CD3, and the fourth candidate data CD4, respectively corresponding to the four paths. The SCL decoder SD may verify validity of the first candidate data CD1, the second candidate data CD2, the third candidate data CD3, and the fourth candidate data CD4 based on the first dynamic frozen bit DF1.

For example, the SCL decoder SD may determine candidate data, which do not satisfy the rule of the first dynamic frozen bit DF1, from among the first candidate data CD1, the second candidate data CD2, the third candidate data CD3, and the fourth candidate data CD4, as error data. According to the rule of the first dynamic frozen bit DF1, a value of the first dynamic frozen bit DF1 may be defined such that a value obtained by performing the XOR operation together with a value of the first information bit IF1 and a value of the second information bit IF2 is a value of "0". When a dynamic frozen bit is used in error detection, invalid data determined as an error from among pieces of candidate data may be detected.

Figure 11D:
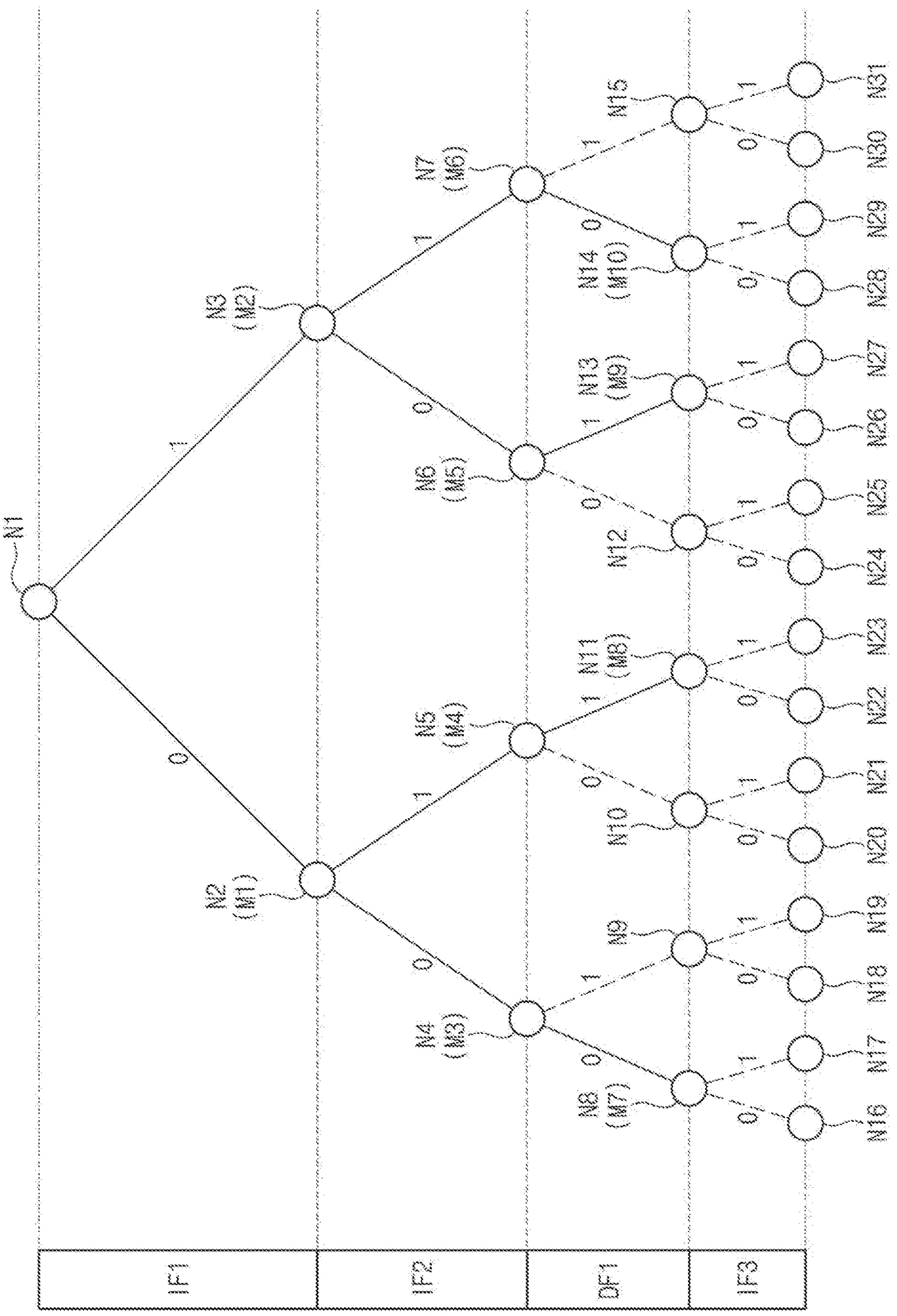

FIG. 11D illustrates an example in which the first dynamic frozen bit DF1 is used in error correction. Referring to FIGS. 1, 2, 9, 11B, and 11D, when the first dynamic frozen bit DF1 is used in error correction, the SCL decoder SD may select only a path satisfying the rule of the first dynamic frozen bit DF1, in the process of selecting a path.

According to the rule of the first dynamic frozen bit DF1, a value of the first dynamic frozen bit DF1 may be defined such that a value obtained by performing the XOR operation together with a value of the first information bit IF1 and a value of the second information bit IF2 is a value of "0".

For example, at the fourth node N4, the SCL decoder SD may select a path on which a value of the first dynamic frozen bit DF1 is "0", that is, the eighth node N8 such that the rule of the first dynamic frozen bit DF1 is satisfied. For example, the SCL decoder SD may perform an XOR operation based on values of the first information bit IF1 ("0") and the second information bit IF2 ("0"), and select the path corresponding to "0". The SCL decoder SD may calculate a seventh metric M7, based on the likelihood of the path up to the eighth node N8.

At the fifth node N5, the SCL decoder SD may select a path on which a value of the first dynamic frozen bit DF1 is "1", that is, the eleventh node N11 such that the rule of the first dynamic frozen bit DF1 is satisfied. For example, the SCL decoder SD may perform an XOR operation based on values of the first information bit IF1 ("0") and the second information bit IF2 ("1"), and select the path corresponding to "1". The SCL decoder SD may calculate an eighth metric M8, based on the likelihood of the path up to the eleventh node N11.

At the sixth node N6, the SCL decoder SD may select a path on which a value of the first dynamic frozen bit DF1 is "1", that is, the thirteenth node N13 such that the rule of the first dynamic frozen bit DF1 is satisfied. For example, the SCL decoder SD may perform an XOR operation based on values of the first information bit IF1 ("1") and the second information bit IF2 ("0"), and select the path corresponding to "1". The SCL decoder SD may calculate a ninth metric M9, based on the likelihood of the path up to the thirteenth node N13.

At the seventh node N7, the SCL decoder SD may select a path on which a value of the first dynamic frozen bit DF1 is "0", that is, the fourteenth node N14 such that the rule of the first dynamic frozen bit DF1 is satisfied. For example, the SCL decoder SD may perform an XOR operation based on values of the first information bit IF1 ("1") and the second information bit IF2 ("1"), and select the path corresponding to "0". The SCL decoder SD may calculate a tenth metric M10, based on the likelihood of the path up to the fourteenth node N14.

As described above, the SCL decoder SD may correct an error by pruning paths not satisfying the rule of the first dynamic frozen bit DF1 in the process of finding a path of the first candidate data CD1, the second candidate data CD2, the third candidate data CD3, and the fourth candidate data CD4.

In an embodiment, an example in which the graph up to the third information bit IF3 is illustrated and the path up to the first dynamic frozen bit DF1 is found is illustrated in FIGS. 11A to 11D. Paths corresponding to the remaining bits not described may be found identically by the method described with reference to FIGS. 11A to 11D. Thus, additional description will be omitted to avoid redundancy.

FIG. 12 illustrates an example of conditions under which the SCL decoder SD increases the error detection capability or the error correction capability. Referring to FIGS. 1, 2, and 12, in an embodiment, the decoding information DI may include structural information about the LDPC code of the first decoder 250.

In an embodiment, as the degree of variable nodes becomes greater, as the number of cycles of the factor graph FG (refer to FIGS. 6 and 7) decreases, or as a length of a cycle (e.g., the longest cycle) of the factor graph FG becomes longer, the SCL decoder SD may increase the error detection capability.

For example, as the degree of variable nodes becomes greater, as the number of cycles of the factor graph FG (refer to FIGS. 6 and 7) decreases, or as a length of a cycle (e.g., the longest cycle) of the factor graph FG becomes longer, the reliability of error correction of the first decoder 250 may become higher. As the reliability of error correction of the first decoder 250 becomes higher, the SCL decoder SD may increase the error detection capability and may decrease the error correction capability.

In an embodiment, as the degree of variable nodes decreases, as the number of cycles of the factor graph FG (refer to FIGS. 6 and 7) increases, or as a length of a cycle (e.g., the longest cycle) of the factor graph FG becomes shorter, the SCL decoder SD may increase the error correction capability.

For example, as the degree of variable nodes decreases, as the number of cycles of the factor graph FG (refer to FIGS. 6 and 7) increases, or as a length of a cycle (e.g., the longest cycle) of the factor graph FG becomes shorter, the reliability of error correction of the first decoder 250 may become lower. As the reliability of error correction of the first decoder 250 becomes lower, the SCL decoder SD may increase the error correction capability and may decrease the error detection capability.

FIG. 13 illustrates another example of conditions under which the SCL decoder SD increases the error detection capability or the error correction capability. Referring to FIGS. 1, 2, and 13, in an embodiment, the decoding information DI may include status information about the first error correction decoding of the first decoder 250.

In an embodiment, as the number of check nodes not satisfying the check condition decreases, as the number of times of iteration of LDPC decoding increases, or as a syndrome weight decreases, the SCL decoder SD may increase the error detection capability. For example, the syndrome weight may be a sum of values of check nodes after LDPC decoding is completed.

In an embodiment, as the number of check nodes not satisfying the check condition decreases, as the number of times of iteration of LDPC decoding increases, or as a syndrome weight decreases, the reliability of error correction of the first decoder 250 may become higher. As the reliability of error correction of the first decoder 250 becomes higher, the SCL decoder SD may increase the error detection capability and may decrease the error correction capability.

In an embodiment, as the number of check nodes not satisfying the check condition increases, as the number of times of iteration of LDPC decoding decreases, or as a syndrome weight becomes greater, the SCL decoder SD may increase the error correction capability.

For example, as the number of check nodes not satisfying the check condition increases, as the number of times of iteration of LDPC decoding decreases, or as a syndrome weight becomes greater, the reliability of error correction of the first decoder 250 may become lower. As the reliability of error correction of the first decoder 250 becomes lower, the SCL decoder SD may increase the error correction capability and may decrease the error detection capability.

Figure 14:
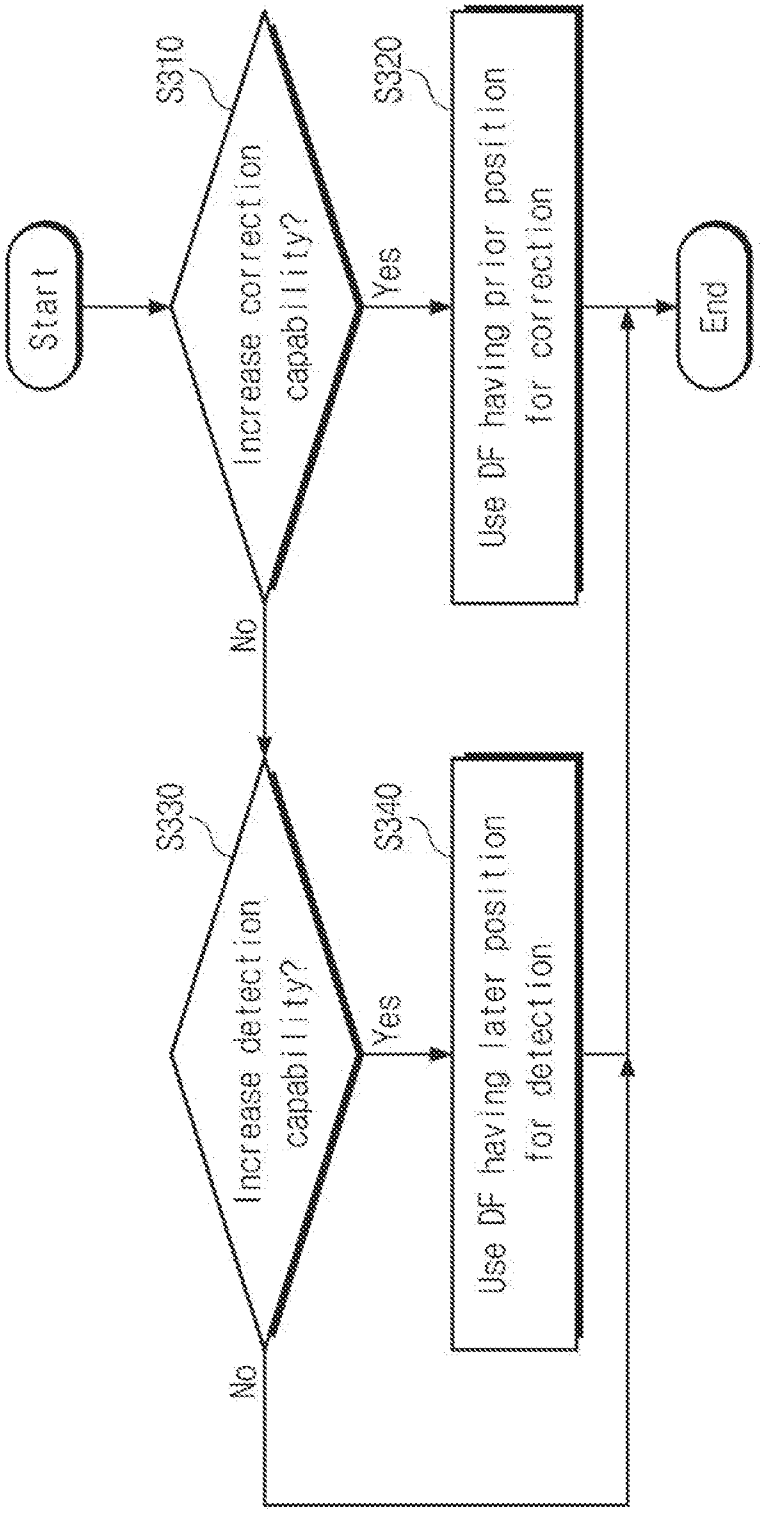
FIG. 14 illustrates a method in which an SCL decoder adjusts the use of a dynamic frozen bit according to an embodiment.

FIG. 14 illustrates an example of a method in which the SCL decoder SD adjusts the use of a dynamic frozen bit. Referring to FIGS. 1, 2, 9, and 14, in operation S310, the SCL decoder SD may determine whether to increase the error correction capability. When there is a need to increase the error correction, in operation S320, the SCL decoder SD may use the dynamic frozen bit DF for error correction.

For example, the SCL decoder SD may use the dynamic frozen bit DF, whose position is the most advanced, from among the dynamic frozen bits DF being used for error detection, for error correction. When the dynamic frozen bit DF of the preceding position is used for error correction, all candidate paths corresponding to an error may be pruned, and thus, an error may further decrease.

When there is no need to increase the error correction capability, in operation S330, the SCL decoder SD may determine whether to increase the error detection capability. When there is a need to increase the error detection capability, in operation S340, the SCL decoder SD may use the dynamic frozen bit DF with a later position, for error correction.

For example, the SCL decoder SD may use the dynamic frozen bit DF, whose position is the latest, from among the dynamic frozen bits DF being used for error correction, for error detection. When the dynamic frozen bit DF of the preceding position is used for error correction, more candidate paths corresponding to an error may be pruned, and thus, an error may further decrease.

When there is no need to increase the error correction capability and there is no need to increase the error detection capability, the SCL decoder SD may maintain the use of the dynamic frozen bits DF. For example, the current position of the dynamic frozen bits DF may be maintained by the SCL decoder SD.

Figure 15:
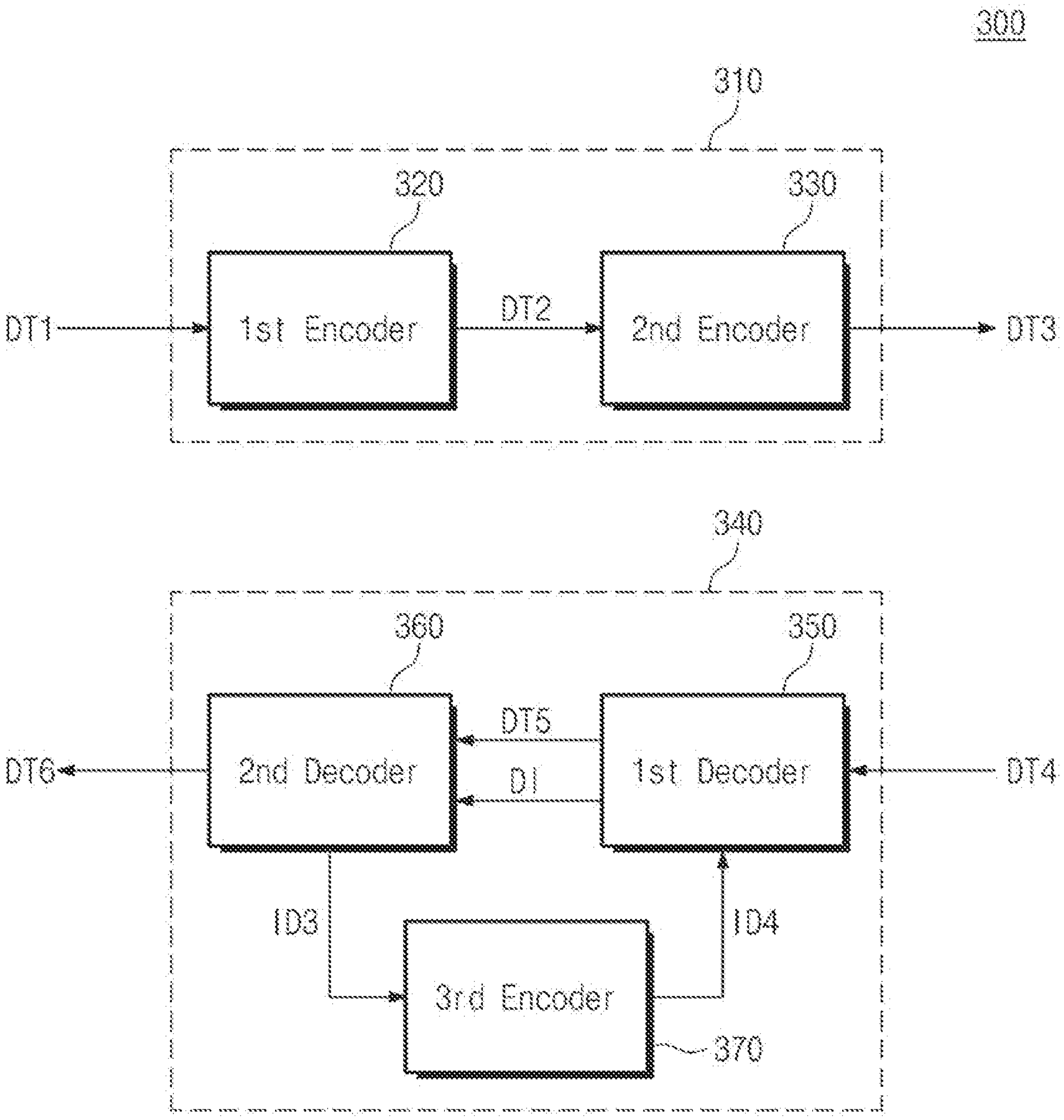
FIG. 15 illustrates an error correction code block according to another embodiment.

FIG. 15 illustrates an error correction code block 300 according to another embodiment. In an embodiment, the error correction code block 300 may correspond to the error correction code block 127 of the memory controller 120 of the storage device 100 of FIG. 1.

Referring to FIGS. 1 and 15, the error correction code block 300 may include an encoding block 310 and a decoding block 340. The encoding block 310 may perform error correction encoding with respect to the first data DT1 to be written in the nonvolatile memory device 110. The decoding block 340 may perform error correction decoding with respect to the fourth data DT4 read from the nonvolatile memory device 110.

The encoding block 310 may include a first encoder 320 and a second encoder 330. The first encoder 320 may perform first error correction encoding with respect to the first data DT1 and may generate the second data DT2. For example, the first error correction encoding may include polar code encoding. However, a kind of the first error correction encoding is not limited thereto.

The second encoder 330 may perform second error correction encoding with respect to the second data DT2 and may generate the third data DT3. For example, the second error correction encoding may include LDPC encoding. However, a kind of the second error correction encoding is not limited thereto.

Configurations and operations of the first encoder 320 and the second encoder 330 may be the same as those of the first encoder 220 and the second encoder 230 of FIG. 2. Thus, additional description will be omitted to avoid redundancy.

The decoding block 340 may include a first decoder 350, a second decoder 360, and a third encoder 370. The first decoder 350 may perform first error correction decoding with respect to the fourth data DT4 or fourth intermediate data ID4 and may generate the fifth data DT5. For example, the first error correction decoding may include LDPC decoding. However, a kind of the first error correction decoding is not limited thereto.

The first decoder 350 may generate the decoding information DI about the first error correction decoding. For example, the decoding information DI may include information about the structure of the first decoder 350 or information about the status of the first error correction decoding (e.g., the status of the result of the first error correction decoding). The first decoder 350 may transfer the decoding information DI to the second decoder 360.

The second decoder 360 may receive the decoding information DI from the first decoder 350. The second decoder 360 may control second error correction decoding, based on the decoding information DI about the first error correction decoding.

The second decoder 360 may perform the second error correction decoding with respect to the fifth data DT5 and may generate the sixth data DT6 or third intermediate data ID3. For example, the second error correction decoding may include SCL decoding. However, a kind of the second error correction decoding is not limited thereto.

The third encoder 370 may perform third error correction encoding with respect to the third intermediate data ID3 and may generate the fourth intermediate data ID4. For example, the third error correction encoding may include LDPC encoding. However, a kind of the third error correction encoding is not limited thereto.

According to an embodiment, the decoding block 340 may combine (or concatenate) and perform heterogeneous error correction decoding. In this case, the decoding block 340 may control the second error correction decoding to be performed after the first error correction decoding, based on the decoding information DI of the first error correction decoding performed previously. Because the decoding information DI of the first error correction decoding performed previously is applied to the second error correction decoding to be performed after the first error correction decoding, the accuracy of error detection or correction of the decoding block 340 may be further improved.

Also, according to an embodiment, the decoding block 340 may combine (or concatenate) heterogeneous error correction decoding and may repeatedly perform the combined (or concatenated) decoding. In this case, in each iteration, the decoding block 340 may control the second error correction decoding to be performed after the first error correction decoding, based on the decoding information DI of the first error correction decoding performed previously. In the iteration of each combined (or concatenated) decoding, because the decoding information DI of the first error correction decoding performed previously is applied to the second error correction decoding to be performed after the first error correction decoding, the second error correction decoding may be differently performed for each combined (or concatenated) decoding, and the accuracy of error detection or correction of the decoding block 340 may be further improved.

In an embodiment, an example in which the third encoder 370 is used to generate the fourth intermediate data ID4 from the third intermediate data ID3 is described with reference to FIG. 15. However, the third encoder 370 may be omitted depending on a kind of an encoding and decoding algorithm which the first encoder 320 and the second decoder 360 use or depending on a kind of an encoding and decoding algorithm which the second encoder 330 and the first decoder 350 use. For example, the third intermediate data ID3 which the second decoder 360 generates may be directly input to the first decoder 350.

Figure 16:
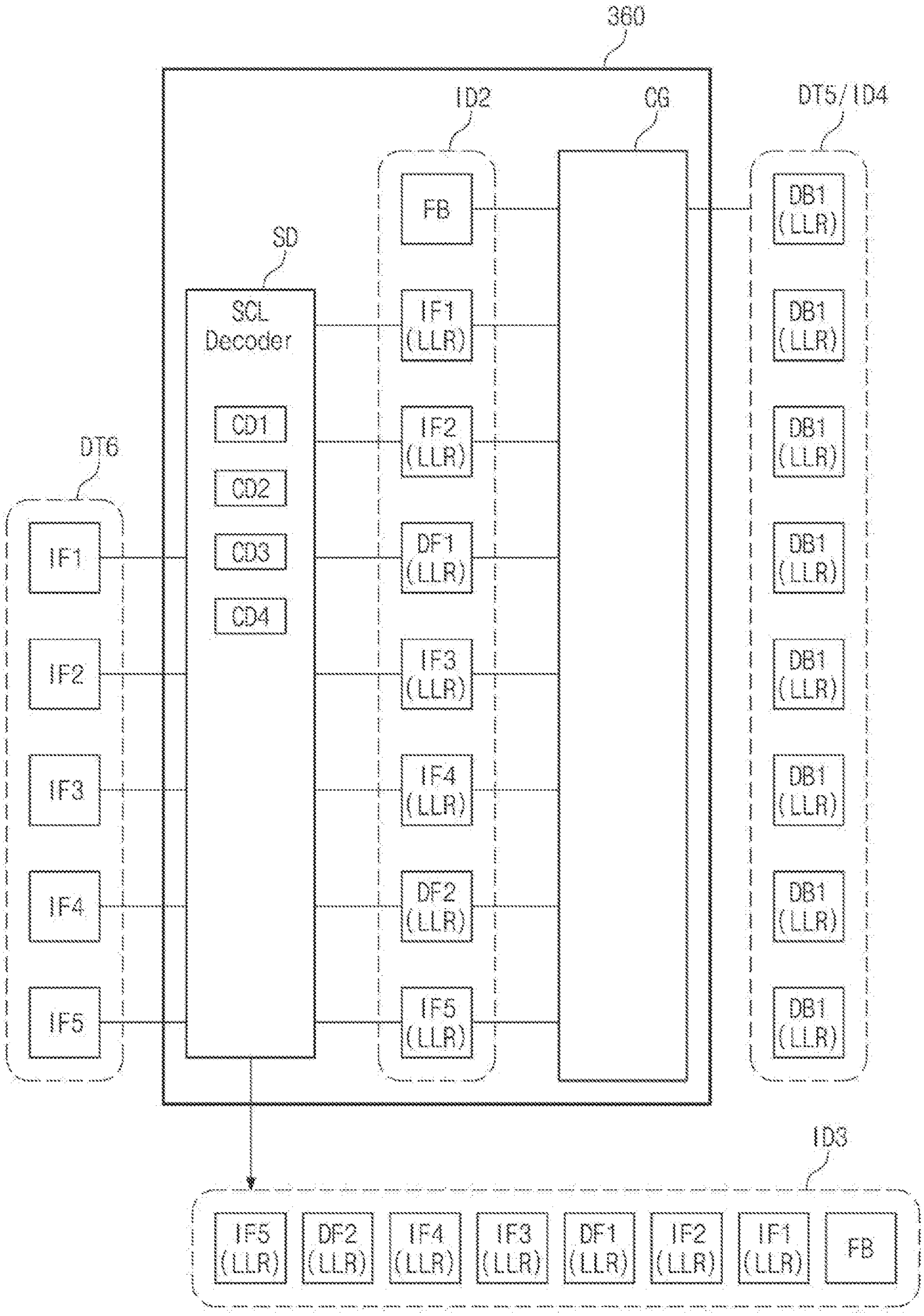
FIG. 16 illustrates a second decoder of a decoding block according to an embodiment.

FIG. 16 illustrates an example of the second decoder 360 of the decoding block 340. Referring to FIGS. 1, 2, and 16, the second decoder 360 may receive the fifth data DT5. The fifth data DT5 may include the first decoded bits DB1 and the corresponding log-likelihood ratios LLR.

The second decoder 360 may include the code graph CG and the SCL decoder SD. The code graph CG may apply polar code decoding to the fifth data DT5. The code graph CG may have the same structure as the code graph CG of FIG. 4 and may perform operations in a direction opposite to that of the code graph CG of FIG. 4.

A result of the operations of the code graph CG may be the second intermediate data ID2. As in the first intermediate data ID1, the second intermediate data ID2 may sequentially include the frozen bit FB, the first information bit IF1, the second information bit IF2, the first dynamic frozen bit DF1, the third information bit IF3, the fourth information bit IF4, the second dynamic frozen bit DF2, and the fifth information bit IF5.

Because the frozen bit FB has a fixed value (e.g., a known bit), the frozen bit FB may not have the log-likelihood ratio LLR. Because the first information bit IF1, the second information bit IF2, the first dynamic frozen bit DF1, the third information bit IF3, the fourth information bit IF4, the second dynamic frozen bit DF2, and the fifth information bit IF5 have changed values, the bits IF1, IF2, DF1, IF3, IF4, DF2, and IF5 may have corresponding log-likelihood ratios LLR.

The SCL decoder SD may receive the second intermediate data ID2. The SCL decoder SD may generate a given number of candidate data based on values of the first information bit IF1, the second information bit IF2, the first dynamic frozen bit DF1, the third information bit IF3, the fourth information bit IF4, the second dynamic frozen bit DF2, and the fifth information bit IF5 and the corresponding log-likelihood ratios LLR. For example, based on the second intermediate data ID2, the SCL decoder SD may generate the first candidate data CD1, the second candidate data CD2, the third candidate data CD3, and the fourth candidate data CD4.

The SCL decoder SD may select one of the first candidate data CD1, the second candidate data CD2, the third candidate data CD3, and the fourth candidate data CD4. When the iteration of the combined (or concatenated) decoding of the first decoder 350 and the second decoder 360 is not performed as much as the given number of times, the SCL decoder SD may output the third intermediate data ID3 as the selected candidate data. The third intermediate data ID3 may sequentially include the frozen bit FB, the first information bit IF1, the second information bit IF2, the first dynamic frozen bit DF1, the third information bit IF3, the fourth information bit IF4, the second dynamic frozen bit DF2, and the fifth information bit IF5 and the corresponding log-likelihood ratios LLR.

When the iteration of the combined (or concatenated) decoding of the first decoder 350 and the second decoder 360 is performed as much as the given number of times, the SCL decoder SD may output the sixth data DT6 as the selected candidate data. For example, the sixth data DT6 may be data whose error correction is completed by the decoding block 340. The sixth data DT6 may sequentially include the first information bit IF1, the second information bit IF2, the third information bit IF3, the fourth information bit IF4, and the fifth information bit IF5.

Except for differences between the descriptions given with reference to FIGS. 15 and 16, configurations and operations of the first decoder 350 and the second decoder 360 may be the same as those of the first decoder 250 and the second decoder 260 described with reference to FIG. 2. Thus, additional description will be omitted to avoid redundancy.

Figure 17:
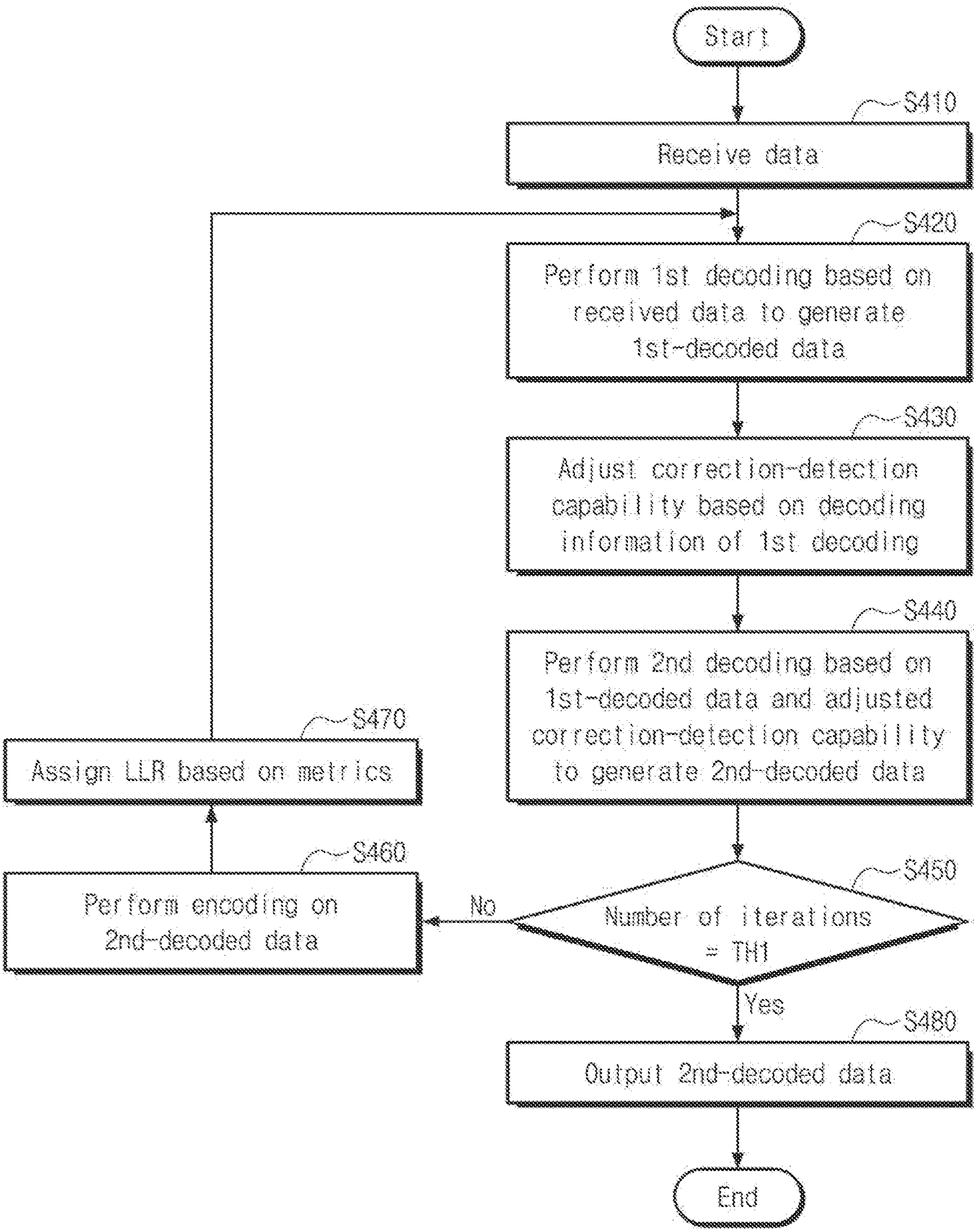
FIG. 17 illustrates a method in which an error correction code block performs error correction decoding according to an embodiment.

FIG. 17 illustrates an example of a method in which the error correction code block 300 performs error correction decoding. Referring to FIGS. 1, 2, and 17, in operation S410, the error correction code block 300 may receive data. For example, the decoding block 340 of the error correction code block 300 may receive the fourth data DT4 read from the nonvolatile memory device 110 through the bus 121.

In operation S420, the decoding block 340 may perform first decoding based on the received data and may generate first decoded data. For example, the first decoder 350 of the decoding block 340 may perform first error correction decoding (e.g., LDPC decoding) with respect to the fourth data DT4 and may generate the fifth data DT5 as the first decoded data.

In operation S430, the decoding block 340 may adjust (e.g., control) the correction-detection capability based on the decoding information DI of the first decoding. For example, the first decoder 350 of the decoding block 340 may transfer the decoding information DI about the first error correction decoding to the second decoder 360. The second decoder 360 may determine a method of performing second error correction decoding (e.g., SCL decoding) based on the decoding information DI. For example, the second decoder 360 may increase the error correction capability or may decrease the error detection capability, or the second decoder 360 may decrease the error correction capability or may increase the error detection capability.

In operation S440, the decoding block 340 may perform second decoding based on the first decoded data and the adjusted correction-detection capability and may generate second decoded data. For example, the second decoder 360 of the decoding block 340 may perform the second error correction decoding with respect to the fifth data DT5 based on the adjusted error correction capability and the adjusted error detection capability and may generate the sixth data DT6 as the second decoded data. For example, the first decoding and the second decoding may be iteratively performed.

In operation S450, the decoding block 340 may determine whether the number of iterations reaches a first threshold value TH1. For example, the decoding block 340 may determine whether the number of times that the first error correction decoding of the first decoder 350 and the second error correction decoding of the second decoder 360 are combined (or concatenated) and are repeated reaches the first threshold value TH1.

When the number of iterations does not reach the first threshold value TH1, in operation S460, the decoding block 340 may control another iteration to be performed. For example, the decoding block 340 may perform encoding with respect to the second decoded data. For example, the third encoder 370 of the decoding block 340 may perform third error correction encoding (e.g., LDPC encoding) with respect to the second decoded data, that is, the third intermediate data ID3.

In operation S470, the decoding block 340 may assign the log-likelihood ratios LLR based on metrics of the second error correction decoding. For example, the third encoder 370 of the decoding block 340 may be an initial log-likelihood ratio of each bit based on a metric of each of bits of the third intermediate data ID3 calculated by the second decoder 360. Afterwards, the decoding block 340 may again start the process from operation S420.

When the number of iterations reaches the first threshold value TH1, in operation S480, the decoding block 340 may output the second decoded data. For example, the second decoder 360 of the decoding block 340 may output the sixth data DT6 as error correction-completed data.

In an embodiment, the increasing of the error detection capability may include increasing the number of frozen bits used in error detection. Because the increasing of the error detection capability causes a decrease in the number of frozen bits to be used in error correction, the error correction capability may decrease.

Likewise, the increasing of the error correction capability may include increasing the number of frozen bits used in error correction. Because the increasing of the error correction capability causes a decrease in the number of frozen bits to be used in error detection, the error detection capability may decrease.

The decoding block 340 may decrease the number of locally distributed errors by setting the error correction capability to be greater than the error detection capability in initial iterations of the combined (or concatenated) decoding of the first error correction decoding of the first decoder 350 and the second error correction decoding of the second decoder 360. The decoding block 340 may detect errors caused by the accumulation of an error of global log-likelihood ratios LLR by setting the error detection capability to be greater than the error correction capability after the initial iterations of the combined (or concatenated) decoding of the first error correction decoding of the first decoder 350 and the second error correction decoding of the second decoder 360.

FIG. 18 illustrates another example of conditions under which the SCL decoder SD increases the error detection capability or the error correction capability. Referring to FIGS. 1, 2, and 18, in an embodiment, the decoding information DI may include status information about first error correction decoding of the first decoder 250.

In an embodiment, as the number of check nodes not satisfying the check condition decreases, as the number of times of iteration of LDPC decoding increases, as a syndrome weight decreases, or as the number of iteration of the combined (or concatenated) decoding increases, the SCL decoder SD may increase the error detection capability. For example, the syndrome weight may be a sum of values of check nodes after LDPC decoding is completed.

For example, as the number of check nodes not satisfying the check condition decreases, as the number of times of iteration of LDPC decoding increases, as a syndrome weight decreases, or as the number of iteration of the combined (or concatenated) decoding increases, the reliability of error correction of the first decoder 250 may become higher. As the reliability of error correction of the first decoder 250 becomes higher, the SCL decoder SD may increase the error detection capability and may decrease the error correction capability.

In an embodiment, as the number of check nodes not satisfying the check condition increases, as the number of times of iteration of LDPC decoding decreases, as a syndrome weight becomes greater, or as the number of iteration of the combined (or concatenated) decoding decreases, the SCL decoder SD may increase the error correction capability.

For example, as the number of check nodes not satisfying the check condition increases, as the number of times of iteration of LDPC decoding decreases, as a syndrome weight becomes greater, or as the number of iteration of the combined (or concatenated) decoding decreases, the reliability of error correction of the first decoder 250 may become lower. As the reliability of error correction of the first decoder 250 becomes lower, the SCL decoder SD may increase the error correction capability and may decrease the error detection capability.

In an embodiment, structural information about the decoding information DI of the decoding block 340 may be the same as that described with reference to FIG. 12. Thus, additional description will be omitted to avoid redundancy.

Figure 19:
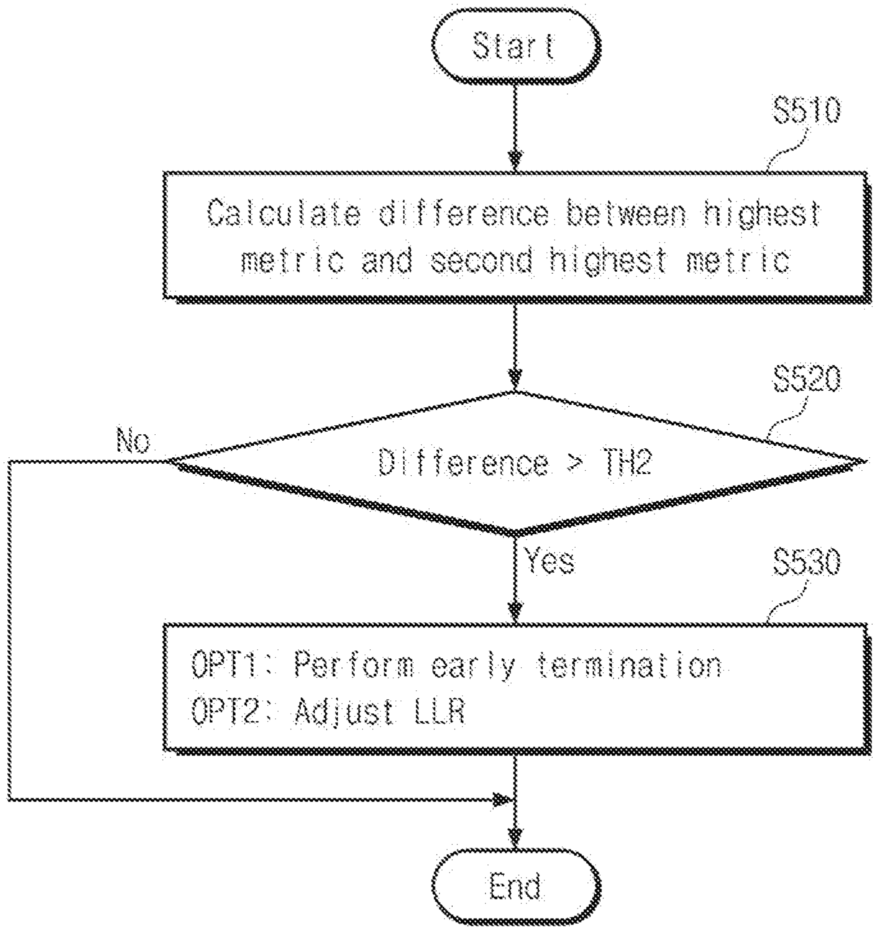
FIG. 19 illustrates a method in which a decoding block adjusts a combined decoding scheme according to an embodiment.

FIG. 19 illustrates a first example of a method in which the decoding block 340 performs combined (or concatenated) decoding. As discussed above, a metric may be calculated based on the log-likelihood ratio LLR of each bit of data. Referring to FIGS. 1, 15, and 19, in operation S510, decoding block 340 may calculate a difference between the highest metric and the second highest metric. For example, the decoding block 340 may calculate a difference between the highest metric and the secondary highest metric among a metric of the last bit of the first candidate data CD1, a metric of the last bit of the second candidate data CD2, a metric of the last bit of the third candidate data CD3, and a metric of the last bit of the fourth candidate data CD4.

In operation S520, the decoding block 340 may determine whether the difference is greater than a second threshold value TH2. When the difference is not greater than the second threshold value TH2, the decoding block 340 may perform a next iteration of the combined (or concatenated) decoding. The SCL decoder SD may select candidate data, in which the metric of the last bit is the lowest, as the third intermediate data ID3. The SCL decoder SD may calculate the initial log-likelihood ratios LLR from metrics of bits of the third intermediate data ID3.

When the difference is greater than the second threshold value TH2, in operation S530, the decoding block 340 may early terminate the iteration of the combined (or concatenated) decoding as a first option OPT1. The decoding block 340 may output candidate data, in which the metric of the last bit is the lowest, as the sixth data DT6.

When the difference is greater than the second threshold value TH2, in operation S530, the decoding block 340 may adjust the log-likelihood ratios LLR as a second option OPT2. For example, the decoding block 340 may select candidate data, in which the metric of the last bit is the lowest, as the third intermediate data ID3. The SCL decoder SD may calculate the initial log-likelihood ratios LLR from the metrics of the bits of the third intermediate data ID3. The SCL decoder SD may adjust the log-likelihood ratios LLR by further decreasing the calculated log-likelihood ratios LLR. The decoding block 340 may accelerate error correction by adjusting the log-likelihood ratios LLR.

In an embodiment, each of the first option OPT1 and the second option OPT2 may be enabled or disabled by the external host device or the processor 124. As another example, the first option OPT1 and the second option OPT2 may have different threshold values and may be enabled or disabled together by the external host device or the processor 124.

Figure 20:
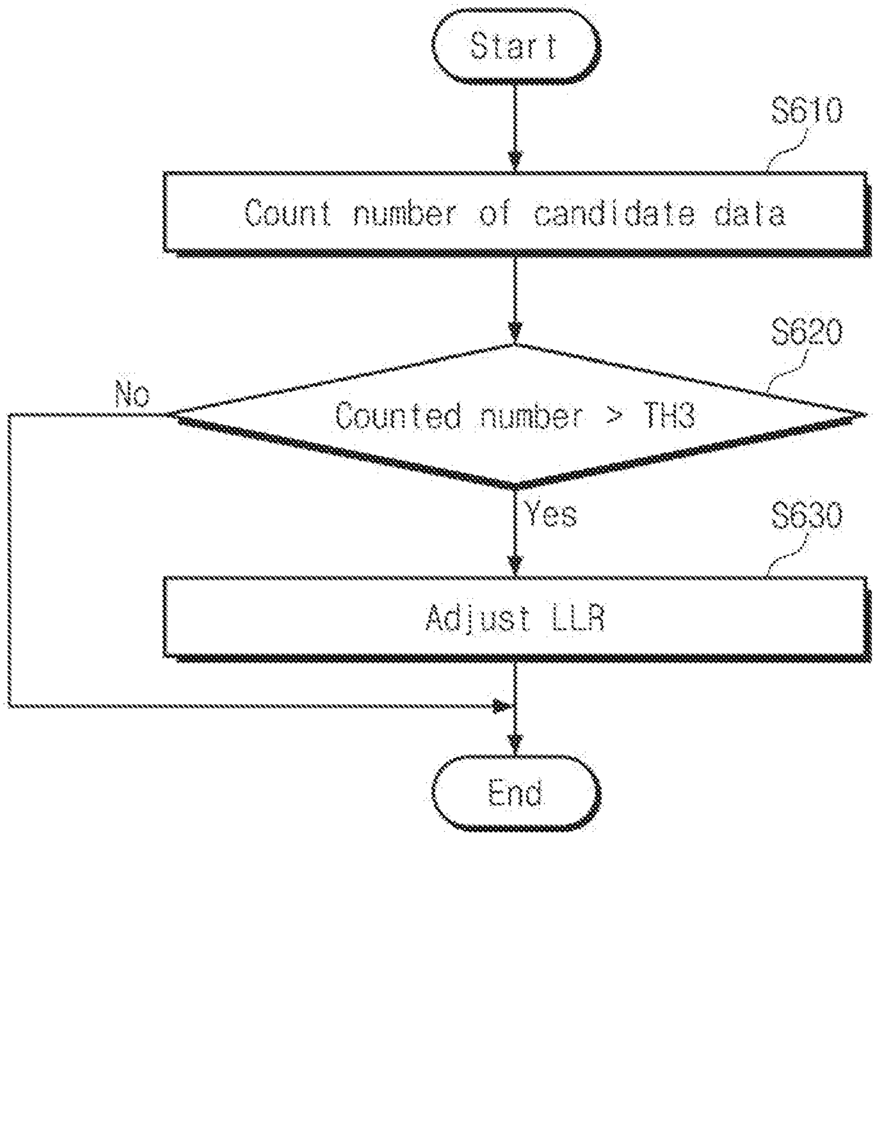
FIG. 20 illustrates a method in which a decoding block adjusts a combined decoding scheme according to an embodiment.

FIG. 20 illustrates a second example of a method in which the decoding block 340 performs combined (or concatenated) decoding. Referring to FIGS. 1, 15, and 20, in operation S610, the decoding block 340 may count the number of candidate data. For example, the decoding block 340 may count the number of valid candidate data determined as not having an error in the error detection process.

In operation S620, the decoding block 340 may determine whether the counted number is greater than a third threshold value TH3. When the counted number is not greater than the third threshold value TH3, the decoding block 340 may perform a next iteration of the combined (or concatenated) decoding. The SCL decoder SD may select candidate data, in which the metric of the last bit is the lowest, as the third intermediate data ID3. The SCL decoder SD may calculate the initial log-likelihood ratios LLR from metrics of bits of the third intermediate data ID3.

When the counted number is greater than the third threshold value TH3, in operation S630, the decoding block 340 may adjust the log-likelihood ratios LLR. For example, the decoding block 340 may select candidate data, in which the metric of the last bit is the lowest, as the third intermediate data ID3. The SCL decoder SD may calculate the initial log-likelihood ratios LLR from the metrics of the bits of the third intermediate data ID3. The SCL decoder SD may adjust the log-likelihood ratios LLR by further decreasing the calculated log-likelihood ratios LLR. The decoding block 340 may accelerate error correction by adjusting the log-likelihood ratios LLR.

Figure 21:
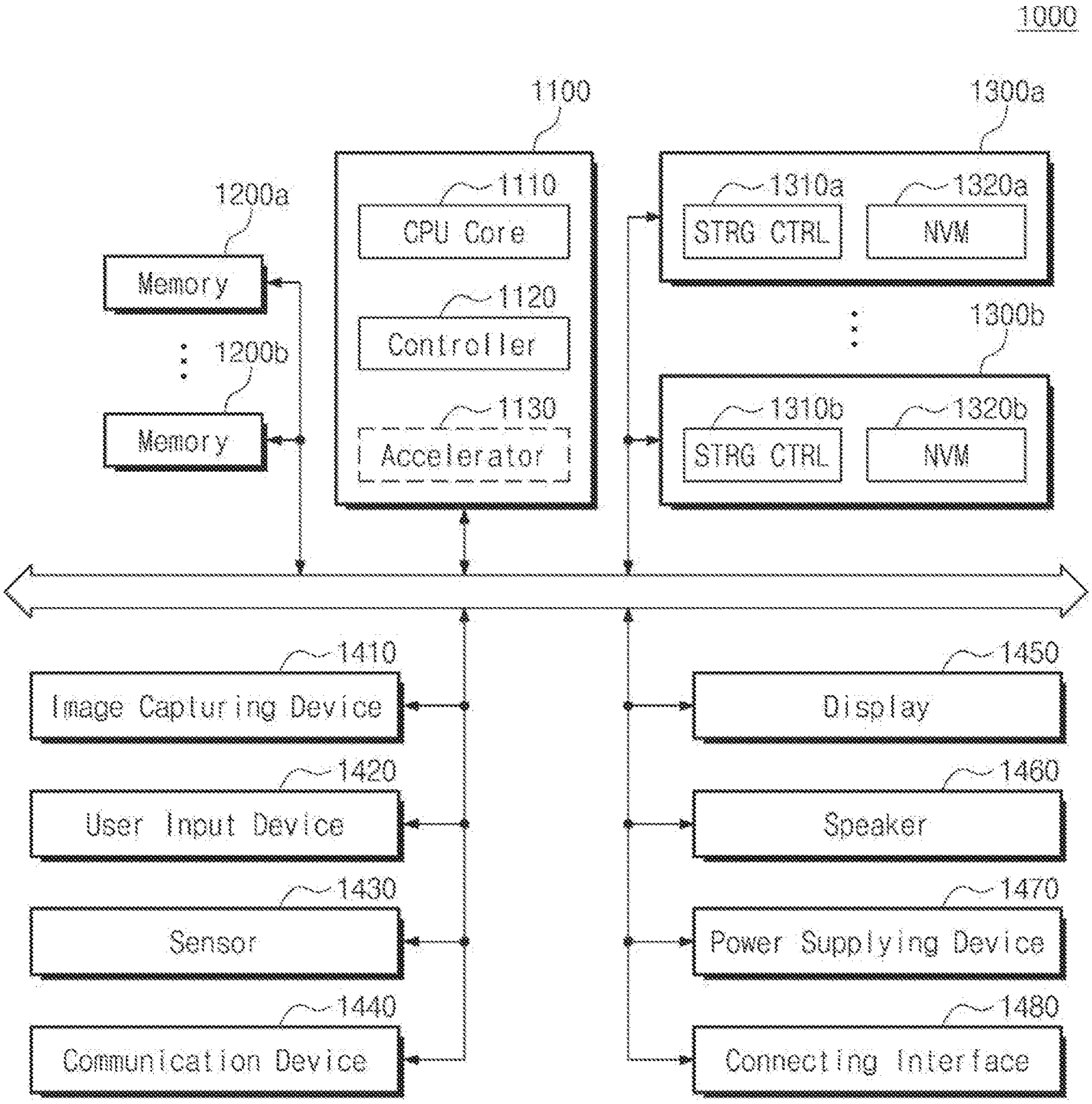
FIG. 21 is a diagram of a system according to an embodiment.

FIG. 21 is a diagram of a system 1000 to which a storage device is applied, according to an embodiment. The system 1000 of FIG. 21 may basically be a mobile system, such as a portable communication terminal (e.g., a mobile phone), a smartphone, a tablet personal computer (PC), a wearable device, a healthcare device, or an Internet of things (IoT) device. However, the system 1000 of FIG. 21 is not necessarily limited to the mobile system and may be a PC, a laptop computer, a server, a media player, or an automotive device (e.g., a navigation device).

Referring to FIG. 21, the system 1000 may include a main processor 1100, memories (e.g., 1200*a* and 1200*b*), and storage devices (e.g., 1300*a* and 1300*b*). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200*a* and 1200*b* and/or the storage devices 1300*a* and 1300*b*. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200*a* and 1200*b* may be used as main memory devices of the system 1000. Although each of the memories 1200*a* and 1200*b* may include a volatile memory, such as static random access memory (SRAM) and/or dynamic RAM (DRAM), each of the memories 1200*a* and 1200*b* may include non-volatile memory, such as a flash memory, phase-change RAM (PRAM) and/or resistive RAM (RRAM). The memories 1200*a* and 1200*b* may be implemented in the same package as the main processor 1100.

The storage devices 1300*a* and 1300*b* may serve as non-volatile storage devices configured to store data regardless of whether power is supplied thereto, and have larger storage capacity than the memories 1200*a* and 1200*b*. The storage devices 1300*a* and 1300*b* may respectively include storage controllers (STRG CTRL) 1310*a* and 1310*b* and NVM (Non-Volatile Memory) s 1320*a* and 1320*b* configured to store data via the control of the storage controllers 1310*a* and 1310*b*. Although the NVMs 1320*a* and 1320*b* may include flash memories having a two-dimensional (2D) structure or a three-dimensional (3D) V-NAND structure, the NVMs 1320*a* and 1320*b* may include other types of NVMs, such as PRAM and/or RRAM.

The storage devices 1300*a* and 1300*b* may be physically separated from the main processor 1100 and included in the system 1000 or implemented in the same package as the main processor 1100. In addition, the storage devices 1300*a* and 1300*b* may have types of solid-state devices (SSDs) or memory cards and be removably combined with other components of the system 1000 through an interface, such as the connecting interface 1480 that will be described below. The storage devices 1300*a* and 1300*b* may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (cUFS) interface, and a compact flash (CF) card interface.

In an embodiment, the storage device 100 described with reference to FIGS. 1 to 20 may be implemented with the storage devices 1300*a* and 1300*b*. The storage devices 1300*a* and 1300*b* may perform combined (or concatenated) error correction decoding and may change a method of performing later error correction decoding based on decoding information about preceding error correction decoding. Also, the storage devices 1300*a* and 1300*b* may repeatedly perform the combined (or concatenated) error correction decoding and may change a method of performing initial error combined (or concatenated) decoding and a method of performing later combined (or concatenated) decoding.

Above, components are described by using the terms "first", "second", "third", etc. However, the terms "first", "second", "third", etc. are used to distinguish components from each other and do not limit the present disclosure. For example, the terms "first", "second", "third", etc. do not involve an order or a numerical meaning of any form.

Above, components according to embodiments are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP). For example, an IP may include circuitry to perform specific functions, and may have a design that includes a trade secret.

According to embodiments, a storage device may sequentially perform first error correction decoding and second error correction decoding and may adjust a method of performing the second error correction decoding based on decoding information about the first error correction decoding. The storage device which improves reliability by correcting an error with improved accuracy because the information about the first error correction decoding is applied to the second error correction decoding and an operating method of the storage device are provided.

While aspects of embodiments have been particularly shown and described, it will be understood that various changes in form and details may be made therein without departing from the spirit and scope of the following claims.

What is claimed is:

1. A storage device comprising:

a nonvolatile memory device; and a controller configured to perform heterogeneous error correction decoding, wherein the controller comprises comprising a first decoder and a second decoder, wherein the controller is configured to:

receive first data from the nonvolatile memory device;

apply, by the first decoder, first error correction decoding to the first data to obtain second data;

control an error correction capability and an error detection capability of second error correction decoding based on information about the first error correction decoding; and apply, by the second decoder, the second error correction decoding to the second data based on the error correction capability and the error detection capability to obtain third data.

2. The storage device of claim 1, wherein the second error correction decoding comprises polar code Successive Cancelation List (SCL) decoding.

3. The storage device of claim 2, wherein the third data comprises information bits, a frozen bit, and dynamic frozen bits, and wherein the controller is further configured to control which of the dynamic frozen bits is used for error correction and which of the dynamic frozen bits is used for error detection.

4. The storage device of claim 3, wherein the controller is further configured to increase the error correction capability by controlling a dynamic frozen bit having a preceding position, from among the dynamic frozen bits used for the error detection, to be used for the error correction.

5. The storage device of claim 1, wherein the controller comprises a Low Density Parity Check (LDPC) decoder configured to perform the first error correction decoding, and wherein the information about the first error correction decoding comprises structural information about the LDPC decoder.

6. The storage device of claim 1, wherein the controller comprises a Low Density Parity Check (LDPC) decoder configured to perform the first error correction decoding, and wherein the information about the first error correction decoding indicates a degree of each of variable nodes of an LDPC code of the LDPC decoder.

7. The storage device of claim 1, wherein the controller comprises a Low Density Parity Check (LDPC) decoder configured to perform the first error correction decoding, and wherein the information about the first error correction decoding indicates a number of cycles of the LDPC decoder.

8. The storage device of claim 1, wherein the controller comprises a Low Density Parity Check (LDPC) decoder configured to perform the first error correction decoding, and wherein the information about the first error correction decoding indicates a length of a cycle of the LDPC decoder.

9. The storage device of claim 1, wherein the first error correction decoding comprises LDPC (Low Density Parity Check) decoding, and wherein the information about the first error correction decoding comprises status information about the LDPC decoding.

10. The storage device of claim 1, wherein the first error correction decoding comprises Low Density Parity Check (LDPC) decoding performed using check nodes, and wherein the information about the first error correction decoding indicates a number of the check nodes not satisfying a check condition.

11. The storage device of claim 1, wherein the first error correction decoding comprises Low Density Parity Check (LDPC) decoding, and wherein the information about the first error correction decoding indicates a number of iterations of the LDPC decoding.

12. The storage device of claim 1, wherein the first error correction decoding comprises Low Density Parity Check (LDPC) decoding, and wherein the information about the first error correction decoding indicates a syndrome weight of the LDPC decoding.

13. The storage device of claim 1, wherein the controller is further configured to:

perform error correction encoding corresponding to the first error correction decoding with respect to the third data to obtain fourth data; and perform the first error correction decoding and the second error correction decoding with respect to the fourth data.

14. The storage device of claim 13, wherein the information about the first error correction decoding indicates a number of iterations of the first error correction decoding and the second error correction decoding thus performed.

15. A storage device comprising:

a nonvolatile memory device; and a controller configured to:

receive first data from the nonvolatile memory device;

perform first error correction decoding with respect to the first data to obtain second data;

control a method of performing second error correction decoding based on information of the first error correction decoding;

perform second error correction decoding with respect to the second data to obtain third data, based on the method; and repeatedly perform the first error correction decoding and the second error correction decoding by further performing the first error correction decoding and the second error correction decoding with respect to the third data.

16. The storage device of claim 15, wherein the second error correction decoding comprises polar code Successive Cancelation List (PCL) decoding, and wherein the controller is further configured to, based on a difference between a metric of candidate data selected from a set of candidate data obtained by the polar code SCL decoding and a metric of another candidate data among the set of candidate data being greater than a threshold value, terminate the repeated performance of the first error correction decoding and the second error correction decoding.

17. The storage device of claim 15, wherein the first error correction decoding comprises Low Density Parity Check (LDPC) decoding, wherein the second error correction decoding comprises polar code Successive Cancelation List (SCL) decoding, and wherein the controller is further configured to, based on a difference between a metric of candidate data selected from a set of candidate data obtained by the polar code SCL decoding and a metric of another candidate data among the set of candidate data being greater than a threshold value, adjust likelihoods of bits of selected data to be transferred to the LDPC decoding.

18. The storage device of claim 15, wherein the first error correction decoding comprises Low Density Parity Check (LDPC) decoding, wherein the second error correction decoding comprises polar code Successive Cancelation List (SCL) decoding, and wherein the controller is further configured to, based on a number of valid candidate data among a set of candidate data obtained by the polar code SCL decoding being greater than a threshold value, adjust likelihoods of bits of selected data to be transferred to the LDPC decoding.

19. A method of operating a storage device which includes a nonvolatile memory device and a controller configured to perform heterogeneous error correction decoding, wherein the controller comprises comprising a first decoder and a second decoder, the method comprising:

applying, by the first decoder, Low Density Parity Check (LDPC) decoding to first data transferred from the nonvolatile memory device to obtain second data;

controlling, by the controller, an error correction capability and an error detection capability of polar code Successive Cancelation List (SCL) decoding, based on decoding information about the LDPC decoding; and applying, by the second decoder, the polar code SCL decoding to the second data based on the error correction capability and the error detection capability to obtain third data.

20. The method of claim 19, further comprising:

performing, by the first decoder, the LDPC decoding with respect to the third data;

modifying, by the controller, the error correction capability and the error detection capability; and performing, by the second decoder, the polar code SCL decoding.

* * * * *